US007741192B2

(12) United States Patent
Shimoyama et al.

(10) Patent No.: US 7,741,192 B2
(45) Date of Patent: Jun. 22, 2010

(54) SEMICONDUCTOR DEVICE AND MANUFACTURING METHOD THEREOF

(75) Inventors: Kazuo Shimoyama, Nagano (JP); Manabu Takei, Nagano (JP); Haruo Nakazawa, Nagano (JP)

(73) Assignee: Fuji Electric Systems Co., Ltd. (JP)

( * ) Notice: Subject to any disclaimer, the term of this patent is extended or adjusted under 35 U.S.C. 154(b) by 1107 days.

(21) Appl. No.: 11/208,459

(22) Filed: Aug. 19, 2005

(65) Prior Publication Data

US 2006/0038206 A1    Feb. 23, 2006

(30) Foreign Application Priority Data

| Aug. 19, 2004 | (JP) | ............................ 2004-240094 |
| Oct. 27, 2004 | (JP) | ............................ 2004-312590 |
| Jan. 25, 2005 | (JP) | ............................ 2005-017486 |

(51) Int. Cl.
*H01L 21/76* (2006.01)

(52) U.S. Cl. ...................... 438/433; 438/514; 438/530; 438/511; 438/400; 438/414; 438/198

(58) Field of Classification Search .................. 438/433
See application file for complete search history.

(56) References Cited

U.S. PATENT DOCUMENTS 4,089,021 A  *  5/1978  Sato et al. .................... 257/265

(Continued)

FOREIGN PATENT DOCUMENTS

JP          2-22869 A      1/1990

(Continued)

OTHER PUBLICATIONS

Related co-pending U.S. Appl. No. 11/389,495; Haruo Nakazawa et al.; "Semiconductor Device and Manufacturing Method Thereof"; filed Aug. 19, 2005; Spec. pp. 1-49; Figs. 1-14.

(Continued)

*Primary Examiner*—Long Pham
(74) *Attorney, Agent, or Firm*—Rossi, Kimms & McDowell LLP

(57) ABSTRACT

A thin semiconductor wafer, on which a top surface structure and a bottom surface structure that form a semiconductor chip are formed, is affixed to a supporting substrate by a double-sided adhesive tape. Then, on the thin semiconductor wafer, a trench to become a scribing line is formed by wet anisotropic etching with a crystal face exposed so as to form a side wall of the trench. On the side wall of the trench with the crystal face thus exposed, an isolation layer for holding a reverse breakdown voltage is formed by ion implantation and low temperature annealing or laser annealing so as to be extended to the top surface side while being in contact with a p collector region as a bottom surface diffused layer. Then, laser dicing is carried out to neatly dice a collector electrode, formed on the p collector region, together with the p collector region, without presenting any excessive portions and any insufficient portions under the isolation layer. Thereafter, the double-sided adhesive tape is removed from the collector electrode to produce semiconductor chips. A highly reliable reverse-blocking semiconductor device can thus be formed at a low cost.

8 Claims, 33 Drawing Sheets

U.S. PATENT DOCUMENTS 4,362,599 A * 12/1982 Imaizumi et al. ............ 438/416
4,904,609 A    2/1990 Temple
5,688,702 A * 11/1997 Nakagawa et al. .......... 438/234

FOREIGN PATENT DOCUMENTS

| JP | 10-256152 A | 9/1998 |
| JP | 2001-185727 A | 7/2001 |
| JP | 2002-76017 A | 3/2002 |
| JP | 2005-64301 A | 3/2005 |
| JP | 2006-059876 A | 3/2006 |

OTHER PUBLICATIONS

K.E. Bean, et al.; "Dielectric Isolation: Comprehensive, Current and Future"; Journal of the Electrochemical Society; Jan. 1977; vol. 124, No. 1; p. 5C-12C.

* cited by examiner

IMPLANTATION OF B⁺ IONS

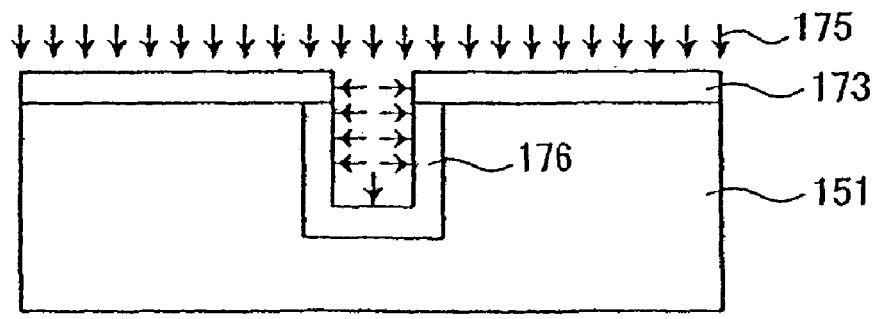
FIG. 30C (Prior Art)
FIG. 31 (Prior Art)
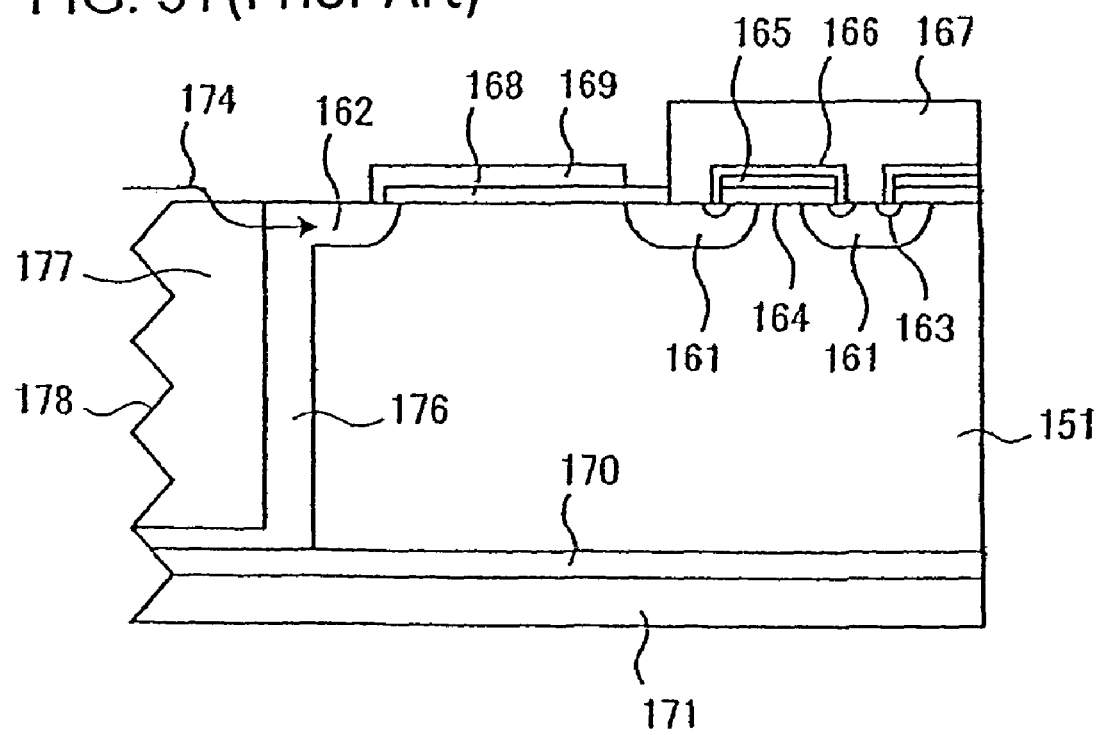

SEMICONDUCTOR DEVICE AND MANUFACTURING METHOD THEREOF

CROSS REFERENCE TO RELATED APPLICATIONS

This application claims priority from Japanese applications Serial Nos. JP PA 2004-240094, filed on Aug. 19, 2004, JP PA 2004-312590, filed on Oct. 27, 2004, and JP PA 2005-017486, filed on Jan. 25, 2005, the contents of all of which are incorporated herein by reference.

BACKGROUND OF THE INVENTION

A. Field of the Invention

The present invention relates to a power semiconductor device used in a device such as a power conversion device and a manufacturing method thereof, and particularly to a process of forming an isolation layer in a bidirectional device or a reverse-blocking device having bidirectional voltage withstanding characteristics.

B. Description of the Related Art

In a semiconductor device of a reverse-blocking type, reverse-blocking capability equivalent to forward-blocking capability is required. In order to secure reverse-blocking capability, it is necessary to make a p-n junction holding a reverse breakdown voltage extend from the bottom surface of a semiconductor chip to its top surface. A diffused layer for forming the p-n junction extended from the top surface to the bottom surface is an isolation layer.

FIGS. 28A to 28C are cross sectional views showing conventional manufacturing steps in a related manufacturing method in the order in a case of forming an isolation layer in a related reverse-blocking IGBT presented by its principal part. The method is one of forming the isolation layer by coating and diffusion. First, on semiconductor wafer 151, oxide film 152, having a film thickness of about 2.5 μm is formed by thermal oxidation as a dopant mask (FIG. 28A). Next, oxide film 152 is subjected to patterning etching, by which opening 153 is formed for forming an isolation layer (FIG. 28B).

Following this, opening 153 is coated with boron source 154. Thereafter, a high temperature and lengthy heat treatment of semiconductor wafer 151 is carried out in a diffusion furnace to form a p-type diffused layer with a thickness on the order of several hundred micrometers (FIG. 28C). The p-type diffused layer becomes isolation layer 155. Then, although not particularly illustrated, after a top surface structure is formed, the bottom surface of semiconductor wafer 151 is ground until ground surface 156 reaches isolation layer 155 to thin semiconductor wafer 151. On ground surface 156, a bottom surface structure is formed which is made up of a p collector region and a collector electrode. Subsequent to this, semiconductor wafer 151 is cut at a scribing line positioned at the center of separation layer 155 to form an IGBT chip.

FIG. 29 is a cross sectional view showing a principal part of the related reverse-blocking IGBT whose isolation layer 155 is formed by the method shown in FIGS. 28A to 28C. In FIG. 29, reference numeral 161 denotes a p well region, 162 denotes a p voltage withstanding region, 163 denotes an emitter region, 164 denotes a gate insulator film, 165 denotes a gate electrode, 166 denotes an interlayer insulator film, 167 denotes an emitter electrode, 168 denotes a field oxide film, 169 denotes a field plate, 170 denotes a p collector region, 171 denotes a collector electrode, and 172 denotes a dicing face.

FIGS. 30A to 30C are cross sectional views showing manufacturing steps in order in another conventional case of forming an isolation layer in a related reverse-blocking IGBT presented by its principal part. In this method the isolation layer is formed by providing a trench and forming a diffusion layer on the side wall of the trench. First, an etching mask is formed with thick oxide film 173 having a thickness of several micrometers (FIG. 30A). Next, a trench having a depth of the order of several hundred micrometers is formed by carrying out dry etching (FIG. 30B). Then, an impurity is introduced into the side wall of the trench by means of vapor phase diffusion 175 to form isolation layer 176 (FIG. 30C).

FIG. 31 is a cross sectional view of a principal part of the related reverse-blocking IGBT in which isolation layer 176 is formed by the method shown in FIGS. 30A to 30C. Trench 174 is filled with reinforcing material 177. Thereafter, dicing is carried out along a scribing line, by which an IGBT chip is cut from semiconductor wafer 151. In this way, a reverse-blocking IGBT is completed. Reference numeral 178 denotes a dicing face. The other constituents are the same as those shown in FIG. 29.

Such a method of providing trench 174 and forming isolation layer 176 on the side wall of trench 174 is disclosed in JP-A-2-22869, JP-A-2001-185727 and JP-A-2002-76017. In JP-A-2-22869, it is disclosed that a trench is formed from the top surface of a device to a bottom side junction so as to surround an active layer, and a diffusion layer is then formed on the side face of the trench to form an isolation layer with an end of the bottom side junction of the device extended to the top surface of the device. In JP-A-2001-185727 and JP-A-2002-76017, it is disclosed that, as in JP-A-2-22869, a trench is formed from the top surface of the device to a bottom junction and a diffusion layer is then formed on the side face of the trench to thereby make the device provided as a device having a reverse-blocking capability.

In a method of forming the isolation layer in the reverse-blocking IGBT shown in FIGS. 28A to 28C, a high temperature and lengthy diffusion treatment is necessary for diffusing boron by carrying out heat treatment from boron source 154 (a liquid diffusion source of boron) coated on the surface to form isolation layer 155 with a diffusion depth of the order of several hundred micrometers. This makes quartz fixtures forming a diffusion furnace such as a quartz board, a quartz tube and a quartz nozzle necessary. Such fixtures cause fatigue, contamination by foreign materials from a heater and strength reduction due to devitrification of the quartz fixtures.

Moreover, in forming isolation layer 155 by the coating and diffusion method, it becomes necessary to form a masking oxide film (oxide film 152). The masking oxide film is required to be provided as a thick oxide film with a high quality for being made to withstand the lengthy boron diffusion. As a method of obtaining a silicon oxide film with high resistance of mask, that is, with a high quality, there is a thermal oxidation method.

However, it is necessary to form a thermal oxide film with a film thickness of about 2.5 μm in order to prevent boron atoms from penetrating through the masking oxide film during the diffusion processing of isolation layer 155 with boron, which takes place at high temperature for a long time, e.g., at 1300° C. for 200 hours. For forming such a thermal oxide film with a film thickness of about 2.5 μm, an oxidation time required at an oxidation temperature of 1150° C., for example, is about 200 hours in dry oxidation (dry atmosphere of oxygen), by which a high quality oxide film can be obtained.

Even with wet or pyrogenic oxidation, which is known to require a shorter oxidation time compared with that in dry oxidation though there is slight inferiority in quality of an obtained oxidized film, a long oxidation time of about 15 hours is still necessary. Furthermore, in the above oxidation processing, a large amount of oxygen is introduced into a silicon wafer. This introduces crystal defects such as oxygen deposits and oxidation induced stacking faults (OSF) and produces oxygen donors to thereby cause adverse effects such as characteristics deterioration and reliability degradation of a device.

Furthermore, also in the step of diffusing boron carried out after boron source 154 has been coated, the above high temperature and lengthy diffusion processing is usually carried out under an atmosphere of oxygen. This causes oxygen atoms to be introduced into crystal lattices in the wafer as interstitial oxygen atoms. Thus, also in the diffusion step, crystal defects such as oxygen deposits, oxygen donor production, OSF and slip dislocations are introduced. It is known that a leakage current is increased in a p-n junction formed in a wafer with such crystal defects being introduced and a breakdown voltage and reliability are significantly degraded in an insulator film formed on the wafer by thermal oxidation. Moreover, oxygen atoms taken in during diffusion processing become donors to cause an adverse effect of lowering a breakdown voltage.

In the method of forming the isolation layer shown in FIGS. 28A to 28C, approximately isotropic diffusion of boron progresses toward a silicon bulk from the opening of the masking oxide film. Thus, boron diffusion of up to 200 μm in the depth direction causes the boron to be inevitably diffused also in the lateral direction up to 160 μm. This causes an adverse effect on reduction in device pitch and chip size.

In the method of forming the isolation layer shown in FIGS. 30A to 30C, trench 174 is formed by dry etching and boron is introduced into the side wall of the formed trench 174 to form the isolation layer. Thereafter, trench 174 is filled with reinforcing material 177 such as an insulator film or semiconductor film. Since a trench with a high aspect ratio can be formed, the formation method shown in FIGS. 30A to 30C is more advantageous for reduction in device pitch as compared to the forming method shown in FIGS. 28A to 28C.

However, the processing time required for etching to a depth of the order of 200 μm is on the order of as long as 100 minutes per one wafer when a typical etching equipment is used. This brings adverse effects such as an increase in lead time and the amount of maintenance. Moreover, when a deep trench is formed by dry etching with a silicon oxide ($SiO_2$) film used as a mask, a thick silicon oxide film with a thickness of several micrometers is necessary because the etching selectivity is 50 or less. The thick silicon oxide film causes adverse effects such as increase in cost, reduction in a rate of acceptable products due to introduction of process-induced crystal defects such as OSFs and oxygen deposits.

Further, when a process of forming an isolation layer in which a deep trench with a high aspect ratio that is formed by dry etching is used, there is a problem in that residues such as chemical residue 179 and resist residue 180 are left in the trench as shown in FIG. 32 to cause adverse effects such as reduction in yield and reduction in reliability. When a dopant such as phosphorus or boron is introduced into the side wall of a trench, dopant introduction usually is carried out by implanting dopant ions with the wafer inclined because of the vertical side wall of the trench. However, introduction of a dopant into the side wall of the trench having a high aspect ratio causes adverse effects such as reduction in an effective dose (and an accompanying increase in implantation time), a decrease in effective projected range, a dose loss due to presence of a screen oxide film and reduction in implantation uniformity. Therefore, in order effectively to introduce an impurity into a trench having a high aspect ratio, a vapor phase diffusion is used in which a wafer is exposed to an gasified atmosphere of a dopant such as $PH_3$ (phosphine) or $B_2H_6$ (diborane) instead of implanting dopant ions into an wafer. The vapor phase diffusion, however, is inferior in fine controllability of dose compared with ion implantation.

Moreover, when a trench having a high aspect ratio is filled with an insulator film, a space referred to as a void is produced in the trench which causes a reduction in reliability. A method previously has been proposed in which a trench is formed with anisotropic dry etching and then boron is diffused from the inner face of the trench to form an isolation layer (Japanese Patent Application No. 2004-36274). By the proposed method, the spread of boron in the lateral direction in a wafer can be inhibited. Furthermore, in the methods disclosed in each of the above-described JP-A-2-22869, JP-A-2001-185727 and JP-A-2002-76017, it is conceivable that a step of filling a trench with a reinforcing material may be necessary for cutting a wafer at a scribing line to provide a semiconductor chip and a manufacturing cost is therefore increased.

The present invention is directed to overcoming or at least reducing the effects of one or more of the problems set forth above.

SUMMARY OF THE INVENTION

In order to solve the above-described problems in the art, it is an object of the invention to provide a semiconductor device having high reliability, small device pitch and small chip size. Moreover, it is another object of the invention to provide a method of manufacturing a semiconductor device which is capable of forming an isolation layer without carrying out high temperature and long time diffusion processing and long time oxidation processing. Furthermore, it is still another object of the invention to provide a method of manufacturing a semiconductor device that is capable of manufacturing a semiconductor device having high reliability at a low cost.

In order to solve the above-explained problems and achieve the above objects, a semiconductor device according to a first aspect of the invention is characterized by including:

a second conductivity type base region selectively provided in a surface region on a first principal surface of a first conductivity type semiconductor substrate;

a first conductivity type emitter region selectively provided in a surface region on the base region;

a MOS gate structure including:
   a gate insulator film provided on a surface of a section of the base region, the section being positioned between the semiconductor substrate and the emitter region; and
   a gate electrode provided on the gate insulator film;

an emitter electrode being in contact with the emitter region and the base region;

a second conductivity type collector layer provided on a surface layer of a second principal surface of the semiconductor substrate;

a collector electrode being in contact with the collector layer; and a second conductivity type isolation layer surrounding the MOS gate structure, reaching the second principal surface from the first principal surface while being inclined to the second principal surface, and being coupled to the collector layer, each of the first principal surface and the second principal surface being a {100} plane, and the isolation layer being an impurity layer formed by introducing a second conductivity type impurity into a side wall of a {111} plane of a trench formed in the semiconductor substrate.

A semiconductor device according to a second aspect of the invention is characterized in that, in the device according to the first aspect of the invention, the second conductivity type isolation layer has an angle of inclination of 54.7° to the second principal surface. A semiconductor device according to a third aspect of the invention is characterized in that, in the device according to the first aspect of the invention, the trench is filled with an insulator film or a semiconductor film.

A method of manufacturing a semiconductor device according to a fourth aspect of the invention is characterized in that, in manufacturing a semiconductor device having:

a second conductivity type base region selectively provided in a surface region on a first principal surface of a first conductivity type semiconductor substrate;

a first conductivity type emitter region selectively provided in a surface region on the base region;

a MOS gate structure including:
a gate insulator film provided on a surface of a section of the base region, the section being positioned between the semiconductor substrate and the emitter region; and
a gate electrode provided on the gate insulator film;

an emitter electrode being in contact with the emitter region and the base region;

a second conductivity type collector layer provided on a surface layer of a second principal surface of the semiconductor substrate;

a collector electrode being in contact with the collector layer; and a second conductivity type isolation layer surrounding the MOS gate structure, reaching from the first principal surface to the second principal surface while being inclined to the second principal surface, and being coupled to the collector layer, each of the first principal surface and the second principal surface being a {100} plane, and a surface of the isolation layer being a {111} plane, the method includes the steps of:
covering the first principal surface of the first conductivity type semiconductor substrate with a mask having openings of a desired pattern;

forming a trench whose cross sectional shape is one of a V-shape and a trapezoid-shape on the semiconductor substrate by carrying out wet anisotropic etching with sections of the first principal surface of the semiconductor substrate without being covered by the mask made in contact with an alkaline solution; and forming the second conductivity type isolation layer by introducing a second conductivity type impurity into a side wall of the trench.

A method of manufacturing a semiconductor device according to a fifth aspect of the invention is characterized in that, in the method according to the fourth aspect of the invention, the trench is formed so as to be inclined at an angle of 54.7° to the second principal surface, and the second conductivity type impurity is introduced into the side wall by ion implantation. A method of manufacturing a semiconductor device according to a sixth aspect of the invention is characterized in that, in the method according to the fourth or the fifth aspect of the invention, after the MOS gate structure including the gate insulator film and the gate electrode is formed on the first principal surface side, the formation of the trench and the introduction of the second conductivity type impurity are carried out in the order to form the second conductivity type isolation layer. A method of manufacturing a semiconductor device according to a seventh aspect of the invention is characterized in that, in the method according to the fourth or the fifth aspect of the invention, after the MOS gate structure including the gate insulator film and the gate electrode is formed and the emitter electrode is formed on the first principal surface side, the formation of the trench and the introduction of the second conductivity type impurity are carried out in the order to form the second conductivity type isolation layer.

A method of manufacturing a semiconductor device according to an eighth aspect of the invention is characterized in that, in the method according to the fourth or the fifth aspect of the invention, after the MOS gate structure including the gate insulator film and the gate electrode is formed and the emitter electrode is formed on the first principal surface side and the surface protection film of the first principal surface side is formed, the formation of the trench and the introduction of the second conductivity type impurity are carried out in the order to form the second conductivity type isolation layer. A method of manufacturing a semiconductor device according to a ninth aspect of the invention is characterized in that, in the method according to any one of the fourth to the eighth aspects of the invention, the second conductivity type impurity is introduced into the side wall of the trench before the trench is filled with one of an insulator film and a semiconductor film, and heat treatment is thereafter carried out.

According to the first to the ninth aspects of the invention, in the wet anisotropic etching with an alkaline solution, the etching mask can be thinned by forming the mask with a silicon oxide film or a silicon nitride ($Si_3N_4$) film having very high mask selectivity. For example, when a silicon oxide film is used for an etching mask and a potassium hydroxide (KOH) aqueous solution is used for an etching solution, mask selectivity is very large, as much as 350 to 500. This allows a silicon oxide film as a mask oxide film to be very thin. Therefore, when a mask oxide film is formed by thermal oxidation, an oxidation temperature can be lowered and an oxidation time can be significantly shortened. This can reduce a problem of large lead time and a problem of causing crystal defects due to oxygen introduction at oxidation that are experienced in related devices and methods.

Moreover, a silicon oxide film formed by chemical vapor deposition (CVD) has sufficient mask selectivity as an etching mask, although such a silicon oxide film is a little inferior to a thermal oxide film in film quality (resistance of mask). Thus, a TEOS (tetraethylorthosilicate) film or a silicon nitride film formed by reduced pressure CVD or plasma-assisted CVD can be used as an etching mask. In this case, a temperature for forming the film with CVD is as low as 200 to 680° C., so that in the latter part of a wafer forming process, namely after formation of a MOS gate structure, after a wafer forming process, or after formation of a surface protection film, a trench for forming an isolation layer can be formed.

In wet anisotropic etching with an alkaline solution, an etching rate can be obtained that is very high. For example, in the case of carrying out etching at 110° C. by using a potassium hydroxide aqueous solution with a concentration of 54 wt %, the etching rate is about 8 µm/min. In addition, in wet etching, the etching can be carried out by a system referred to as a batch processing system in which several wafers or even tens of wafers can be simultaneously processed, which is very effective in lead time reduction and cost reduction.

Moreover, in the wet anisotropic etching with an alkaline solution, an etching temperature is taken at 200° C. or less. This makes a thermal load so small as to exert no influence on a dopant profile in the active region. Furthermore, even though structures of metals with comparatively low melting points such as aluminum (Al) or of non-heat-resistant materials are formed on the wafer before the trench is formed by the wet anisotropic etching, no influence is exerted on the structures by carrying out the etching.

Moreover, by forming the trench by wet anisotropic etching with an alkaline solution and by thereafter carrying out implantation of boron ions into the side wall of the trench, a heat treatment temperature can be made lower than that in a related method and a heat treatment time can be made shorter than that in a related method. This allows an effect of reduction in a lead time at formation of the isolation layer and an accompanying improvement in a rate of acceptable products. In addition, the taper angle of the side wall of the trench is very large compared with that of the trench formed by dry etching. This can reduce adverse effects of a related method in ion implantation, namely those such as reduction in an effective dose, loss of a dose due to presence of a screen oxide film, loss of a dose due to reflection and re-emission of an ion beam, and a reduction in the effective projected range. Furthermore, with the taper angle of the side wall of the trench being very large, chemical and resist residues in the trench can be easily removed, which is largely effective in enhancing yield and in improving reliability.

In addition, in the wet anisotropic etching with an alkaline solution, when a mask alignment is arranged parallel or perpendicular to <110> crystal direction on the (100) silicon wafer, the taper angle of the side wall of the trench is fixed at 54.7°. This results in minimum process dependent variation. Furthermore, by fixing the side wall of the trench at a taper angle of 54.7°, at the time when the etching in progress comes to provide the trench with a V-shaped cross section, the progress of the etching automatically stops. In other words, the depth of the trench is determined by the opening width of the etching mask. This is effective in making variation in the depth of the trench much smaller than that experienced in a related method.

A method of manufacturing a semiconductor device according to a tenth aspect of the invention is characterized by including the step of:

forming a plurality of diffused layers, a first main electrode and a control electrode on a first principal surface side of a semiconductor wafer;

thinning the semiconductor wafer by grinding a second principal surface of the semiconductor wafer;

forming a diffused layer and a second main electrode in contact with the diffused layer on the second principal surface side of the thinned semiconductor wafer;

affixing the second main electrode to a supporting substrate with an adhesive layer put between;

forming a trench reaching the diffused layer on the second principal surface side from the first principal surface side;

forming on the whole area of the surface of the side wall an isolation layer having the same conductivity type as the diffused layer on the second principal surface side so that the isolation layer is made in contact with the diffused layer on the second principal surface side; and removing the adhesive layer away from the thinned semiconductor wafer to provide the semiconductor wafer as a semiconductor chip.

A method of manufacturing a semiconductor device according to an eleventh aspect of the invention is characterized in that, in the method according to the tenth aspect of the invention, the adhesive layer is formed of at least a thermal foaming tape. A thermal foaming tape is an adhesive tape which loses adhesive force when it is heated. A method of manufacturing a semiconductor device according to a twelfth aspect of the invention is characterized in that, in the method according to the tenth aspect of the invention, a crystal face of the first principal surface of the thinned semiconductor wafer is a {100} plane, and a crystal face of the surface of the trench is a {111} plane. A method of manufacturing a semiconductor device according to a thirteenth aspect of the invention is characterized in that, in the method according to the twelfth aspect of the invention, the trench is formed by wet anisotropic etching.

A method of manufacturing a semiconductor device according to a fourteenth aspect of the invention is characterized in that, in the method according to the tenth or the twelfth aspect of the invention, the isolation layer is formed by ion implantation and low temperature furnace annealing at 500° C. or below. A method of manufacturing a semiconductor device according to a fifteenth aspect of the invention is characterized in that, in the method according to the tenth or the twelfth aspect of the invention, the isolation layer is formed by ion implantation and laser annealing. A method of manufacturing a semiconductor device according to a sixteenth aspect of the invention is characterized in that, in the method according to the fifteenth aspect of the invention, an irradiation energy density of a laser projected onto the surface of the side wall of the trench is constant over the whole area of the surface of the side wall.

A method of manufacturing a semiconductor device according to a seventeenth aspect of the invention is characterized in that, in the method according to the sixteenth aspect of the invention, the irradiation energy density of the laser is 1.5 Joule/cm$^2$ or more. A method of manufacturing a semiconductor device according to a eighteenth aspect of the invention is characterized in that, in the method according to the sixteenth or the seventeenth aspect of the invention, the trench has a depth to the bottom face of 1 mm or less.

According to the tenth to the eighteenth aspects of the invention, a thin semiconductor wafer, formed with a top surface structure and a bottom surface structure for forming a reverse-blocking semiconductor chip, is affixed to a supporting substrate, a trench to be a scribing line is formed on the thin semiconductor wafer, an isolation layer is formed on the side face of the trench, and the semiconductor wafer is removed from the supporting substrate to be provided as semiconductor chips. This allows a dicing process as was carried out in the related method to be omitted. Moreover, no coating and diffusion method is used in forming the isolation layer, so that an adverse effect such as degradation in characteristics due to oxygen can be reduced. Therefore, a reverse-blocking semiconductor device with high reliability can be provided at a reduced cost. Furthermore, by using low temperature annealing or laser annealing for activating the isolation layer, an isolation layer can be provided that is uniform and shallow in diffusion depth. This allows the area occupied by the isolation layer in the semiconductor chip to be made smaller than the area provided by the related coating and diffusion method, which enables a reduction in a device pitch.

A method of manufacturing a semiconductor device according to a nineteenth aspect of the invention is characterized by including the steps of:

forming a plurality of diffused layers, a first main electrode and a control electrode on a first principal surface side of a semiconductor wafer;

thinning the semiconductor wafer by grinding a second principal surface of the semiconductor wafer;

forming a diffused layer and a second main electrode in contact with the diffused layer on the second principal surface side of the thinned semiconductor wafer;

affixing the second main electrode to a supporting substrate with an adhesive layer put between;

forming a trench reaching the diffused layer on the second principal surface side from the first principal surface side;

forming on the whole area of the surface of the side wall an isolation layer having the same conductivity type as the diffused layer on the second principal surface side so that the isolation layer is made in contact with the diffused layer on the second principal surface side by implanting impurity ions into the whole area of the surface of the side wall and carrying out laser irradiation on the area into which the impurity ions are implanted;

cutting off the diffused layer on the second principal surface side and the second main electrode thereunder by carrying out laser irradiation on a bottom face of the trench; and removing the adhesive layer away from the thinned semiconductor wafer to provide the semiconductor wafer as a semiconductor chip.

A method of manufacturing a semiconductor device according to a twentieth aspect of the invention is characterized in that, in the method according to the nineteenth aspect of the invention, the laser irradiation when the isolation layer is formed and the laser irradiation when the diffused layer on the second principal surface side and the second main electrode are cut off are carried out by the same laser irradiation device.

According to the nineteenth and twentieth aspects of the invention, it is necessary to form the device beforehand, then form the isolation layer, and connect the isolation layer to the diffused layer on the side of the second principal surface for controlling a depletion layer. However, by carrying out formation of the isolation layer with the device affixed to the supporting substrate, even though a trench is formed for forming the isolation layer, no wafer is separated into chip-shaped pieces until the ion implantation process and the annealing process in the trench forming section are finished. Moreover, for affixing the device to the supporting substrate, a double-sided adhesive tape with a thermal foaming tape and a UV tape bonded together is used to affix the thermal foaming tape onto the device surface and affix the UV tape to the supporting substrate. This makes the double-sided adhesive tape foamed so that it is easily removed from the device after the annealing processing.

Furthermore, by carrying out the annealing process after the ion implantation with laser annealing, the isolation layer can be activated with its temperature instantaneously elevated up to that near the melting point of silicon. Hence, dopant (p-type dopant such as B and Al, for example) ions implanted for forming the isolation layer can be activated more highly than those annealed by low temperature furnace annealing carried out at a temperature of 500° C. or less. At this time, only the region down to several micrometers from the surface is activated, so that no influence is exerted on the already formed surface electrode.

In addition, after the laser annealing is carried out, the diffused layer and the second main electrode at the bottom of the isolation layer are diced by laser irradiation. Then, the double-sided adhesive tape is thermally foamed to be removed from the wafer to make the wafer provided as individual chips. This allows the second main electrode to be diced neatly without presenting any excessive portions or any insufficient portions under the isolation layer. Therefore, no second main electrode is left with its portion being a little protruded from the edge of the chip or being broken off in a portion under the isolation layer. Moreover, no burr is left on the diced face of the second main electrode, allowing a neat edge (diced face) of the chip to be obtained.

According to the twentieth aspect of the invention, the laser irradiation device acts to activate an ion implanted layer in the laser annealing process and acts to carry out processing in a work mode in the laser dicing process. Since the second main electrode is as thin as several micrometers, the time required for the laser dicing can be shortened, so that the laser dicing is more effective than ordinary dicing. Moreover, the two processes can be carried out as successive processes by changing an irradiation energy density in the same device. Therefore, the two processes can be successively carried out with one device to allow an equipment investment cost to be reduced.

With the semiconductor device and the manufacturing method of the semiconductor device according to the invention, the trench is formed in the silicon semiconductor substrate by wet anisotropic etching with an alkaline solution and impurity ions are implanted into the side wall of the trench, by which the isolation layer can be formed without carrying out high temperature and lengthy diffusion processing and lengthy oxidation processing. Moreover, the isolation layer is formed with the semiconductor substrate affixed to a supporting substrate to thereby allow the isolation layer, connected to the diffused layer on the side of a second principal face, to be easily formed. Furthermore, the supporting substrate is removed after dicing of the semiconductor substrate is carried out by laser irradiation, by which the second main electrode can be diced neatly without presenting any excessive portions or any insufficient portions under the isolation layer. Therefore, the invention is effective in that a highly reliable semiconductor device with small device pitch and chip size can be obtained at a low cost.

BRIEF DESCRIPTION OF THE DRAWINGS

The foregoing advantages and features of the invention will become apparent upon reference to the following detailed description and the accompanying drawings, of which:

FIG. 15 is a cross sectional view showing a principal part of the reverse-blocking IGBT in a state in the course of being manufactured by the manufacturing method according to embodiment 3 of the invention at the step next to that shown in FIG. 14 in which state the semiconductor wafer is affixed to a supporting substrate with a double-sided adhesive tape in between;

FIG. 30C is a cross sectional view showing a principal part of a related reverse-blocking IGBT in a state in the course of being manufactured at the step next to that shown in FIG. 30B in which state an isolation layer is formed in the side wall of the trench;

FIG. 31 is a cross sectional view showing a principal part of a related reverse-blocking IGBT whose isolation layer is formed by the method shown in FIGS. 30A to 30C.

DETAILED DESCRIPTION OF SPECIFIC EMBODIMENTS

Figure 1:
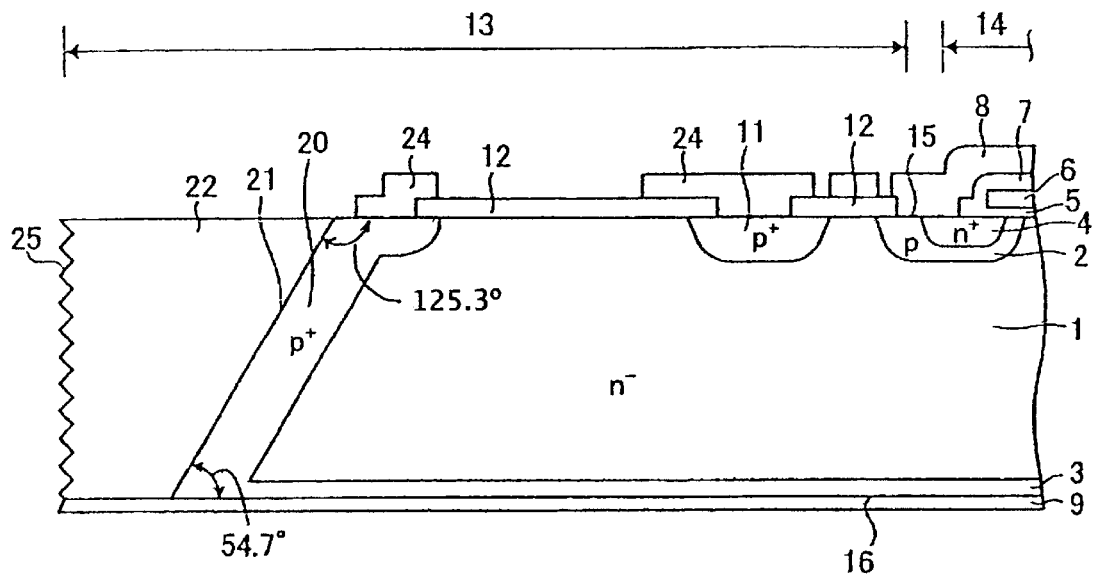
FIG. 1 is a cross sectional view showing an arrangement of a reverse-blocking IGBT according to embodiment 1 of the invention.

In the following, preferred embodiments of a semiconductor device and a method of manufacturing the device according to the invention will be explained in detail with reference to the attached drawings. Examples in each of which the invention is applied to a reverse-blocking IGBT will be described and explained. In the following explanations and the attached drawings, a leading character "n" or "p" attached to names of layers and regions means that majority carriers in the layers and the regions are electrons or holes, respectively. Moreover, a sign "+" attached to the leading character "n" or "p" means that the layer and the region have a comparatively high impurity concentration, and a sign "−" attached to the leading character "n" or "p" means that the layer and the region have a comparatively low impurity concentration. Furthermore, arrangements denoted with the same reference numerals and signs are similar, so that redundant explanations will be omitted.

Embodiment 1

FIG. 1 is a cross sectional view showing an arrangement of a reverse-blocking IGBT according to embodiment 1 of the invention. As is shown in FIG. 1, on first principal surface 15 of n⁻ silicon semiconductor substrate 1 with high resistivity, a plurality of p base regions 2 are selectively formed. On second principal surface 16 on a bottom surface side of the substrate, p⁺ collector layer 3 is formed. A region in between p base regions 2 and p⁺ collector layer 3 in the direction of the thickness of the substrate is originally n⁻ single crystal silicon semiconductor substrate 1, which becomes an n base region. Although not particularly limited, the thickness of n⁻ silicon semiconductor substrate 1, that is, the dimension from first principal surface 15 to second principal surface 16 is 200 μm, for example.

In active region 14 a part of which is shown by an arrow, n⁺ emitter region 4 is selectively formed in the surface layer in each p base region 2. On the outside of active region 14, voltage withstanding structure 13 is formed in a range shown between the two arrows as one type of end structure on the surface of a planar p-n junction to ensure a forward-blocking breakdown voltage of the IGBT. Voltage withstanding structure 13 is positioned on the outside of active region 14 in first principal surface 15. Moreover, voltage withstanding structure 13 is formed by combining a plurality of stages each including a guard ring of p⁺ semiconductor region 11, oxide film 12 and a field plate of metal film 24 which are formed in ring-like on the surface layer of n⁻ silicon semiconductor substrate 1.

Gate electrode 6 is formed over each of the surface of p base region 2 positioned between n⁺ emitter region 4 and the n base region (n⁻ silicon semiconductor substrate 1), the surface of the n base region between p base regions 2 adjacent to each other, and the surface of adjacent p base region 2 positioned between the n base region and one of n⁺ emitter regions 4 in adjacent p base region 2, with gate insulator film 5 held between gate electrode 6 and the respective surfaces. The surface of n⁺ emitter region 4 is covered with emitter electrode 8. The surface of p⁺ collector region 3 is covered with collector electrode 9. Between emitter electrode 8 and gate electrode 6, interlayer insulator film 7 is provided.

On the outside of the voltage withstanding structure 13, p⁺ isolation layer 20 is formed. P⁺ isolation layer 20 is formed along a side wall of trench 21 formed from first principal surface 15. The side wall of trench 21 is inclined at an angle of about 54.7° to second principal surface 16. Therefore, p⁺ isolation layer 20 is inclined at an angle of about 54.7° to second principal surface 16 and therefore about 125.3° to first principal surface 15 with a strip-like cross sectional shape.

Between p⁺ isolation layer 20 and dicing face 25 to be formed by cutting work such as dicing, filler region 22 is formed. Filler region 22 is a region filled with an insulator film of a material such as SOG (Spin-On-Glass), BPSG (Boro-Phospho Silicate Glass), polysilazine or polyimide, or a semiconductor film of a material such as polysilicon or epitaxial silicon. Trench 21 is filled with filler region 22 before dicing is carried out at dicing face 25. With p⁺ isolation layer 20 thus provided, the depletion layer, spreading before and behind the p-n junction when a reverse bias is applied, can be prevented from spreading over dicing face 25 and a damage region around dicing face 25, by which a sufficient reverse breakdown voltage can be obtained.

Figure 5:
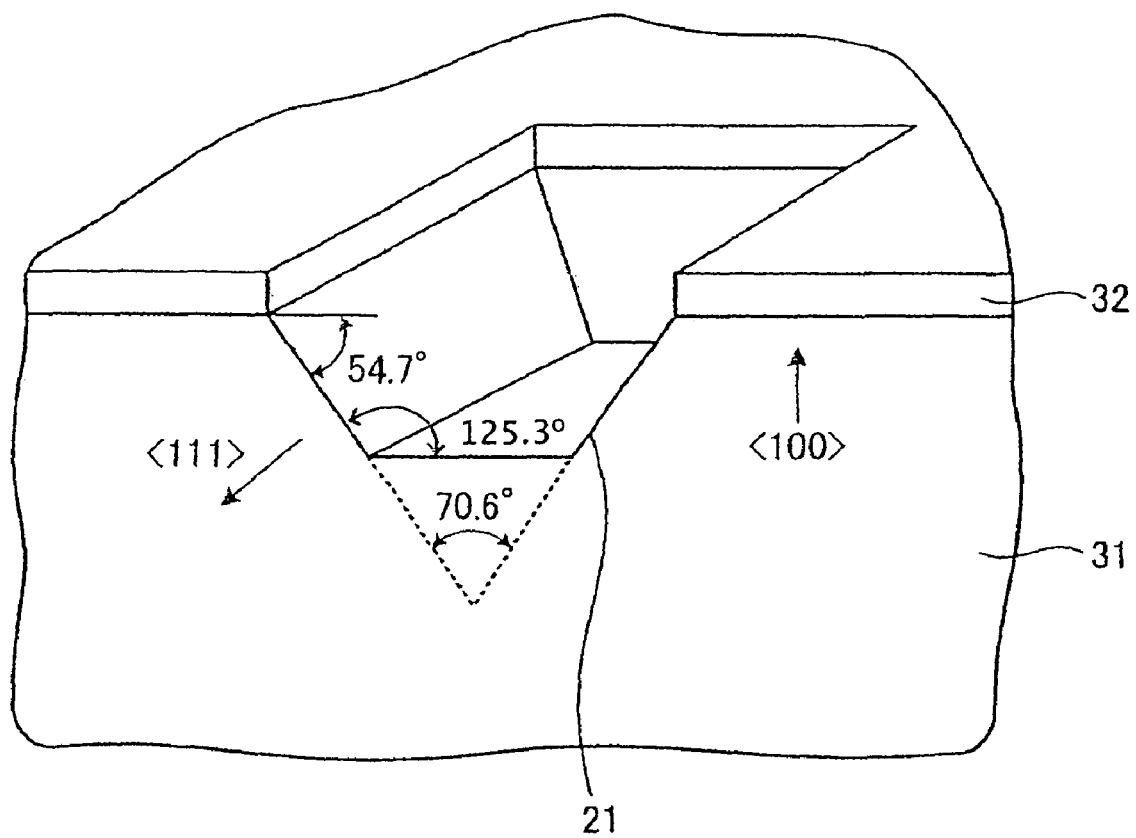
FIG. 5 is a perspective view for explaining wet anisotropic etching of silicon with an alkaline solution.

In order to form p⁺ isolation layer 20, trench 21 is formed in n⁻ silicon semiconductor substrate 1 by carrying out wet anisotropic etching with an alkaline solution. Trench 21 has a V-shaped or trapezoid-shaped cross sectional shape with the side wall inclined at an angle of about 54.7° to second principal surface 16 of n⁻ silicon semiconductor substrate 1. The method of forming trench 21 can be understood with reference to FIG. 5 to FIG. 9. FIG. 5 is a perspective view for explaining wet anisotropic etching of silicon with an alkaline solution. In FIG. 5, reference numeral 31 denotes a silicon wafer and reference numeral 32 denotes an etching mask made of a silicon oxide film or a silicon nitride film.

Figure 6:
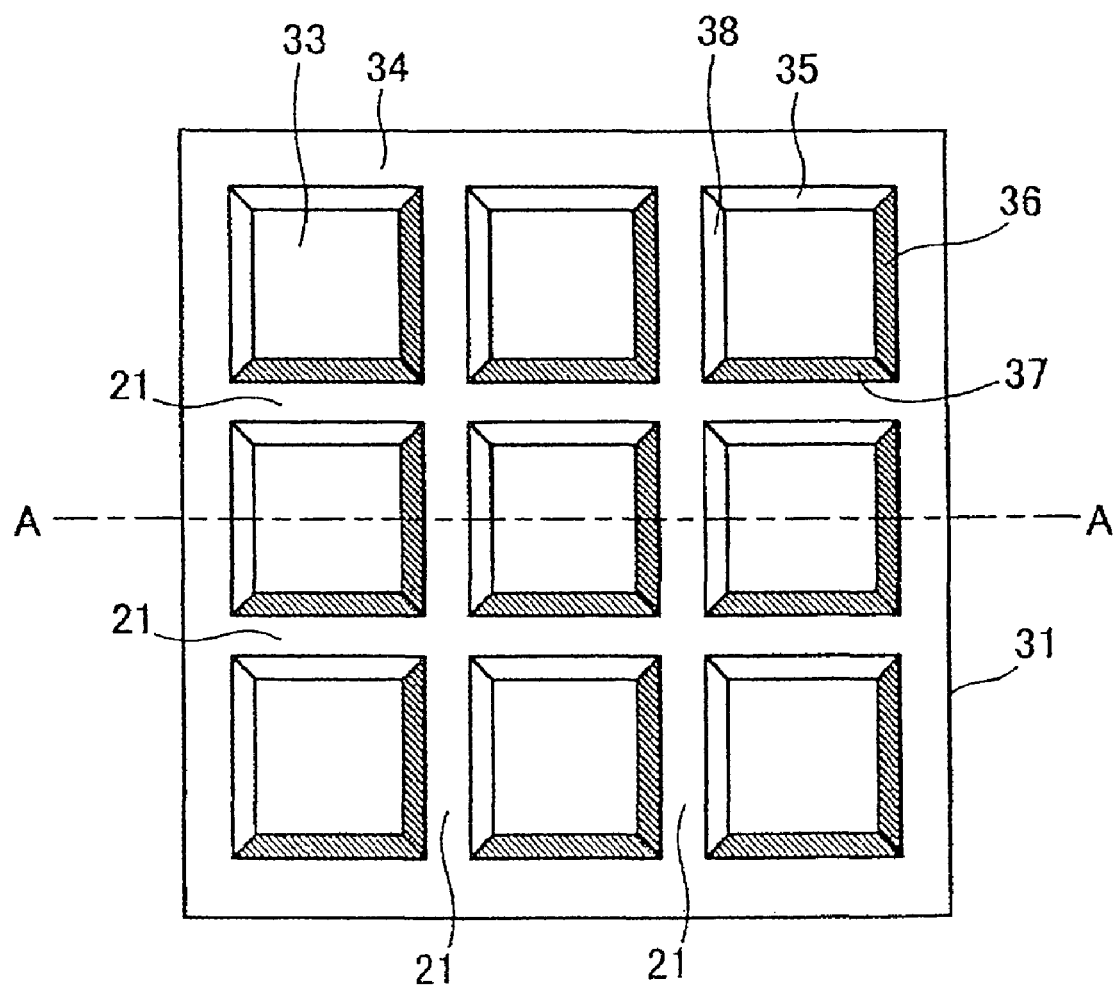
FIG. 6 is a plan view showing a pattern of inverted-trapezoid-shaped trenches formed by wet anisotropic etching of silicon with an alkaline solution.
Figure 7:
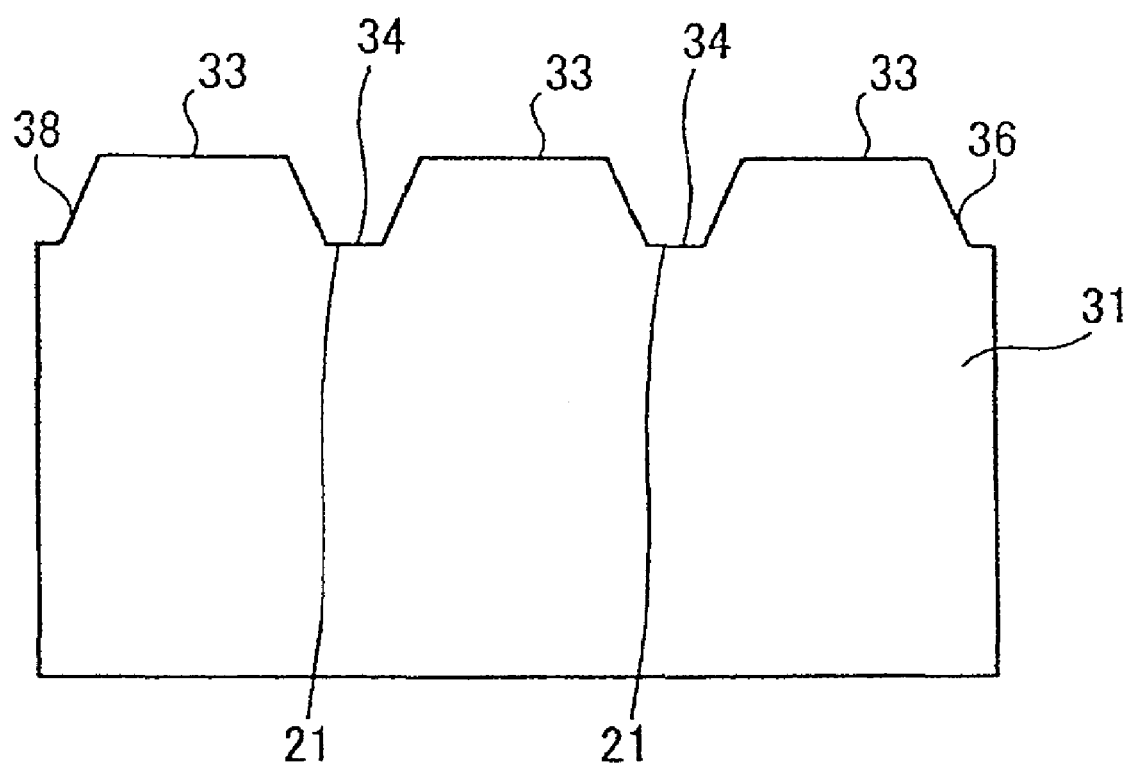
FIG. 7 is a cross sectional view showing a structure along line of cutting plane A-A in FIG. 6.
Figure 8:
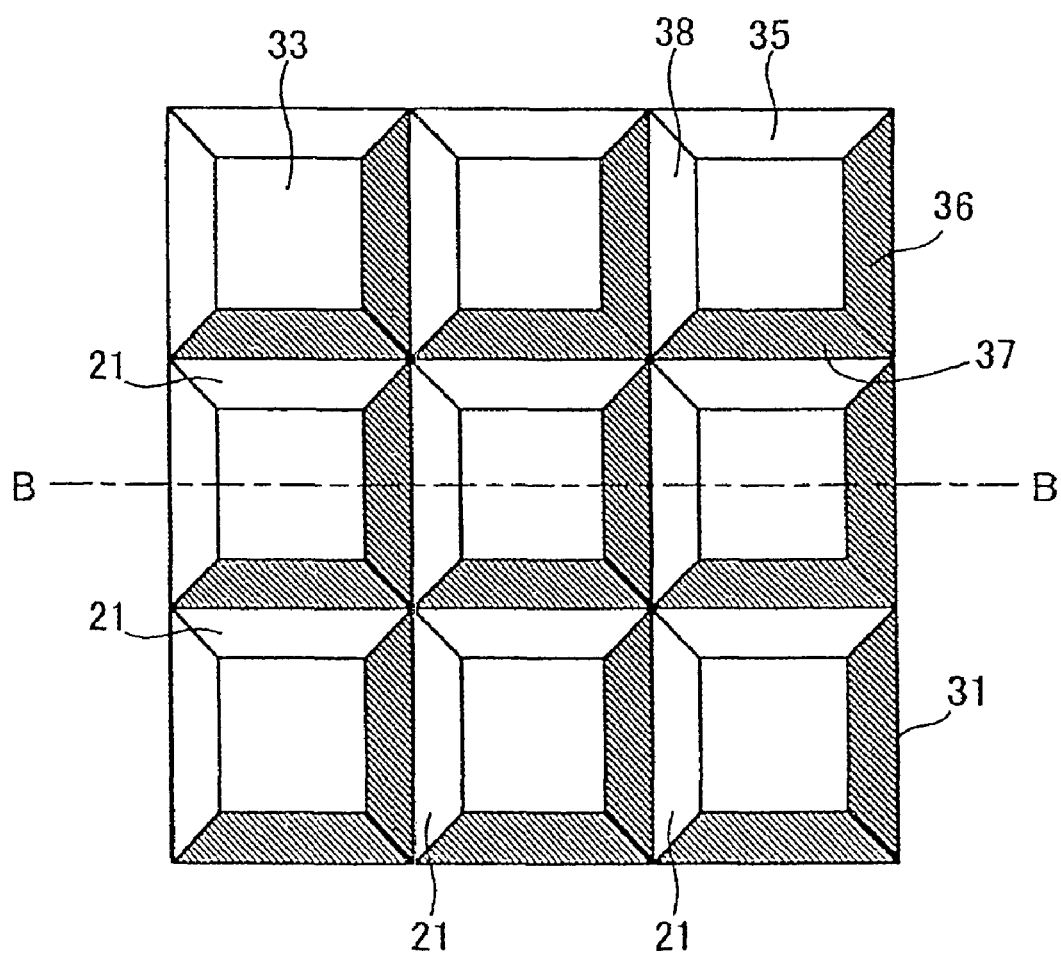
FIG. 8 is a plan view showing a pattern of V-shaped trenches formed by wet anisotropic etching of silicon with an alkaline solution.
Figure 9:
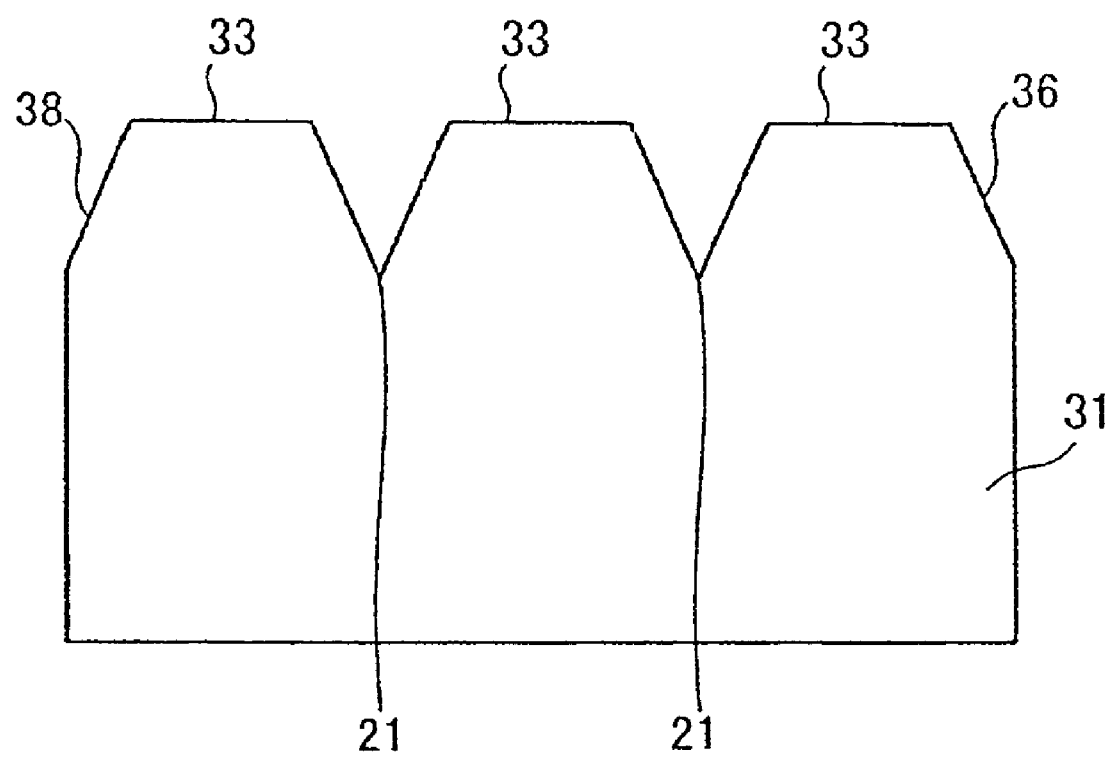
FIG. 9 is a cross sectional view showing a structure along line of cutting plane B-B in FIG. 8.

Moreover, FIG. 6 and FIG. 8 are plan views each showing a pattern of trenches for nine chips formed by wet anisotropic etching of silicon with an alkaline solution. FIG. 7 and FIG. 9 are cross sectional views showing a structure along line of cutting plane A-A in FIG. 6 and a structure along line of cutting plane B-B in FIG. 8, respectively. In FIG. 6 to FIG. 9, reference numeral 33 denotes a (100) plane to be the active region of the device, numeral 34 denotes a (100) plane exposed by etching, and numerals 35, 36, 37 and 38 denote a (111) plane, a (11$\bar{1}$) plane, a (1$\bar{1}\bar{1}$) plane and a (1$\bar{1}$1) plane, respectively, each being the side wall of trench 21.

Aqueous solutions of alkalis such as potassium hydroxide, hydrazine, ethylenediamine, ammonia and TMAH (tetramethylammonium hydroxide) are used as wet anisotropic etching solutions for silicon. Etching of silicon using such solutions is carried out such that etching rates differ depending on directions of crystal planes of silicon, i.e., with anisotropy. Specifically, in using a solution of potassium hydroxide, for example, the etching rates for a (110) plane and the (100) plane are 600 times and 400 times, respectively, that for the (111) plane. Namely, etching actually stops on a crystal plane equivalent to the (111) plane.

Thus, it is known that the etching carried out with an etching mask, formed on a wafer with the (100) plane so that an opening of the etching mask is provided beforehand along the <110> directions, allows a V-shaped trench, a pyramid-shaped pit or a pyramid-shaped cavity structure to be formed. Moreover, it is known that, by adjusting the width of the opening of the etching mask or an etching time, the V-shaped trench, trapezoid-shaped trench or pyramid-shaped pit can be formed with an arbitrary depth and an arbitrary size.

When etching is stopped halfway, trench 21 can be formed with a cross section that is inverted-trapezoid-like, as shown in FIG. 5 to FIG. 7. In this case, an angle formed by each of (111) plane 35, (11$\overline{1}$) plane 36, (1$\overline{11}$) plane 37 and (1$\overline{1}$1) plane 38 to become the side wall of trench 21 and (100) plane 34 exposed by etching is approximately 125.3°, which is larger than the angle of the bottom of the later described V-shaped trench. Therefore, resist residues and chemical residues are more easily removed than in the case of the V-shaped trench and trench 21 can be easily filled with an insulator film without producing any voids in trench 21.

When the etching is further progressed, the (111) plane of the side wall of trench 21 is increased, while (100) plane 34 at the bottom of trench 21 is decreased. Finally, as shown in FIG. 8 and FIG. 9, when (100) plane 34 at the bottom of trench 21 disappears with (111) planes on both of the opposite sides intersecting at an angle of about 70.6°, further etching is substantially stopped. This causes no variation in the depth of V-shaped trench 21 even though the etching time varies. In other words, the depth of V-shape trench 21 is not determined depending on the etching time, but is determined depending on the opening width of etching mask 32.

Specifically, the depth of V-shaped trench 21 has a value for which ½ of the opening width of etching mask 32 is multiplied by tan54.7°. In reverse, for forming V-shaped trench 21 so as to have a desired depth, it is necessary only that the opening width of etching mask 32 have a value for which the depth of trench 21 is multiplied by 2/tan54.7°. For example, when the trench is to be provided with a depth of 200 µm, the opening width of etching mask 32 can be provided as 283 µm, which is advantageous for reduction of device pitch. In this case, however, the bottom of trench 21 forms a somewhat sharp acute angle of about 70.6°. Thus, it is preferable to round the corner of the bottom by carrying out processing such as hydrogen annealing processing, corner rounding oxidation processing, or CDE (Chemical Dry Etching).

Figure 2A:
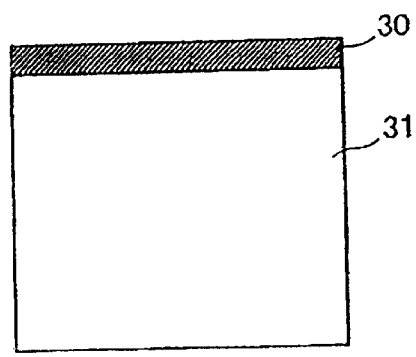
FIG. 2A is a cross sectional view showing the reverse-blocking IGBT shown in FIG. 1 in a state in the course of being manufactured in which state a masking oxide film is formed on a silicon wafer.
Figure 2B:
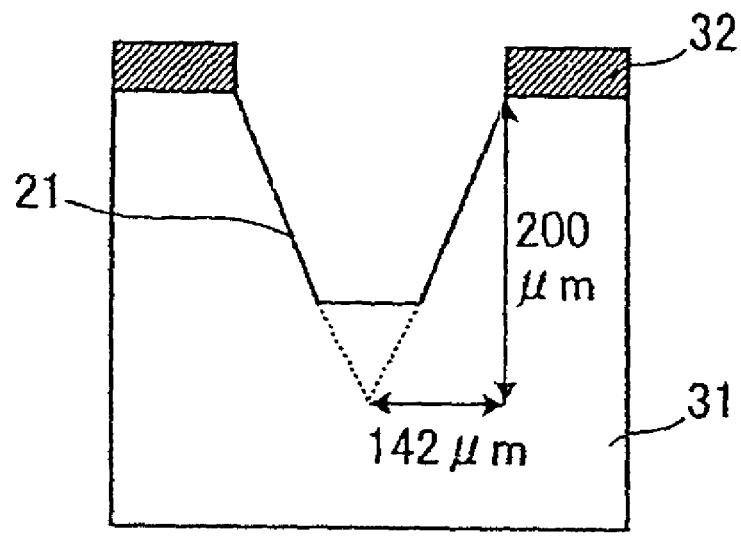
FIG. 2B is a cross sectional view showing the reverse-blocking IGBT shown in FIG. 1 in a state in the course of being manufactured at the step next to that shown in FIG. 2A in which state a trench is formed by wet anisotropic etching and boron ions are implanted into a side wall of the trench.
Figure 2C:
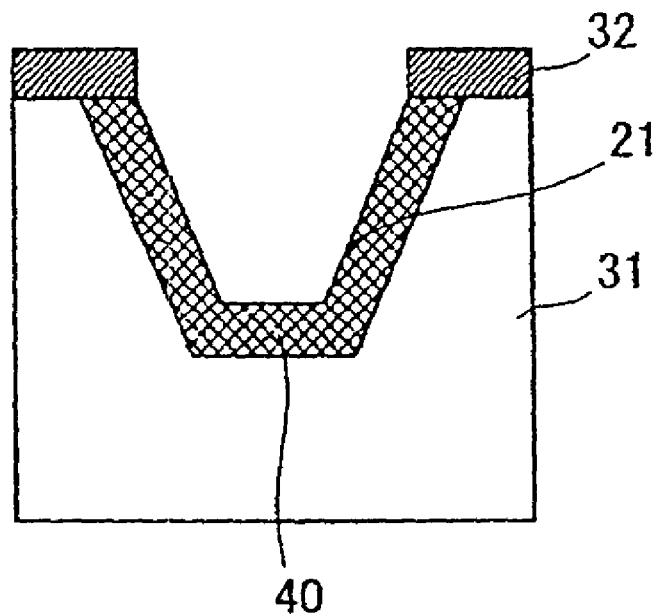
FIG. 2C is a cross sectional view showing the reverse-blocking IGBT shown in FIG. 1 in a state in the course of being manufactured at the step next to that shown in FIG. 2B in which state an isolation layer is formed along the side wall and the bottom of the trench.

Next, a manufacturing process of the reverse-blocking IGBT with the arrangement shown in FIG. 1 will be explained with reference to FIG. 2A to FIG. 2C. First, masking oxide film 30 is formed on silicon wafer 31 by thermal oxidation, for example (FIG. 2A). In wet anisotropic etching of silicon with an alkaline solution, a large etching mask selectivity allows a very thin masking oxide film 30 to be provided. Even with a silicon oxide film formed by CVD (Chemical Vapor Deposition), a sufficient etching mask selectivity can be obtained, even though such a silicon oxide film is a little inferior to a thermal oxide film in film quality (resistance of mask). Thus, a TEOS film formed by reduced pressure CVD or plasma-assisted CVD can be also provided as masking oxide film 30.

Following this, patterning and etching of masking oxide film 30 are carried out to form etching mask 32 with a desired pattern. Then, the above-described wet anisotropic etching with an alkaline solution is carried out to form trapezoid-shaped (or V-shaped shown by the dotted line in FIG. 2B) trench 21. Thereafter, into the side wall of trench 21, boron ions, for example, are introduced by ion implantation (FIG. 2B). At this time, since the taper angle of the side wall of trench 21 to first principal surface 15 as large as about 125.3°, impurity ions can be implanted into the side wall of trench 21 without inclining silicon wafer 31. That is, the ion implantation into silicon wafer 31 can be carried out at a tilt angle of 0°.

In this case, impurity ions can be simultaneously implanted into the four side walls of (111) plane 35, (11$\overline{1}$) plane 36, (1$\overline{11}$) plane 37 and (1$\overline{1}$1) plane 38. Hence, the ion implantation can be easily carried out. Here, like in ion implantation into an ordinary trench side wall, impurity ions can be separately implanted into each of the four side walls of (111) plane 35, (11$\overline{1}$) plane 36, (1$\overline{11}$) plane 37 and (1$\overline{1}$1) plane 38. Thereafter, heat treatment is carried out to activate implanted impurity ions, by which, along the side wall and the bottom (in the case of trapezoid-shaped trench 21), p diffused layer 40 is formed (FIG. 2C). P diffused layer 40 becomes the above-described p$^+$ isolation layer 20.

Next to this, although the illustration is omitted, trench 21 is filled with an insulator film of a material such as SOG, BPSG, polysilazine or polyimide, or a semiconductor film of a material such as polysilicon or epitaxial silicon, by which filler region 22 is formed. Then, an annealing treatment is carried out to improve the film quality of filler region 22 in trench 21 and additionally to improve adhesion between filler region 22 and silicon. When filler region 22 is formed with trench 21 filled with a polysilicon film or an epitaxial silicon film, by filling trench 21 with a p semiconductor film that is formed with a dopant gas, such as $B_2H_6$ (diborane) mixed into silane series gas as a starting material in the course of forming the film, the step of introducing dopant by $B^+$ (boron) ion implantation can be conveniently omitted. At this point, the step of forming p$^+$ isolation layer 20 is completed.

After this, by following well-known steps, an element top surface structure in active region 14 and voltage withstanding structure 13 are formed. Then, second principal surface 16 is ground and etched to thin the wafer. Thereafter, on the side of second principal surface 16, p$^+$ collector layer 3 is formed by carrying out ion implantation with boron ions, for example, and heat treatment of the implanted boron ions. Moreover, on the side of second principal surface 16, collector electrode 9 is formed on collector layer 3 by carrying out deposition and heat treatment of gold (Au), for example. Finally, the wafer is cut into individual chips by cutting processing such as dicing to complete manufacturing of the devices.

Embodiment 2

Figure 3:
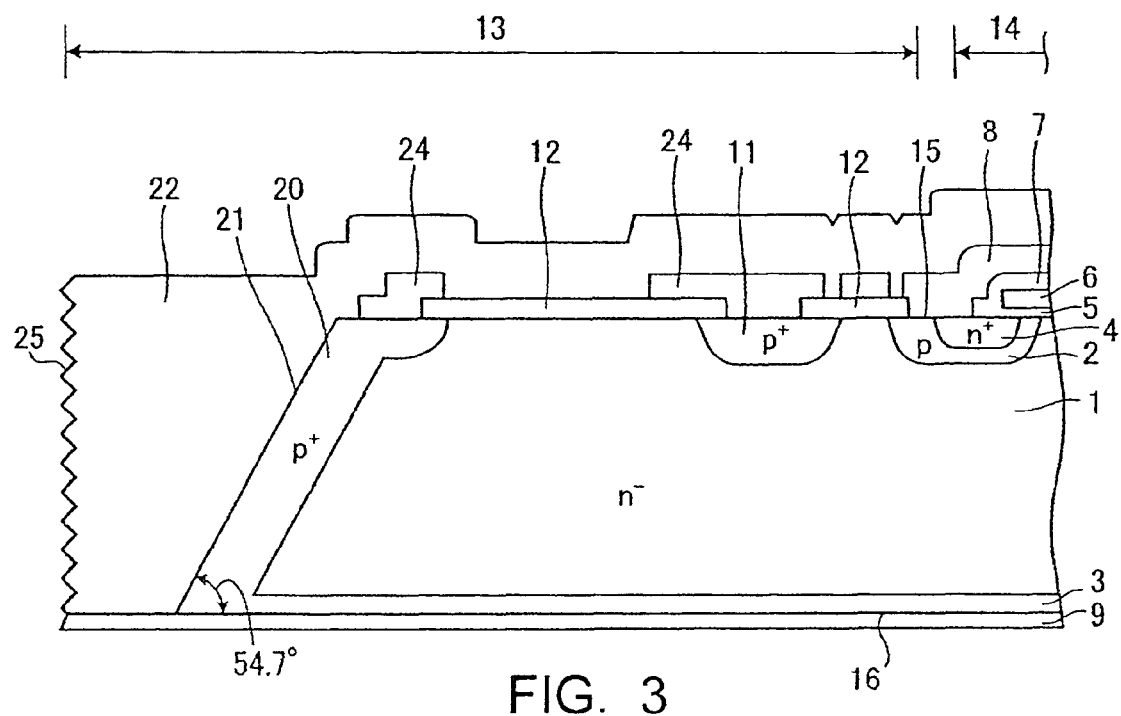
FIG. 3 is a cross sectional view showing an arrangement of a reverse-blocking IGBT according to embodiment 2 of the invention.

FIG. 3 is a cross sectional view showing an arrangement of a reverse-blocking IGBT according to embodiment 2 of the invention. As is shown in FIG. 3, the IGBT according to embodiment 2 has an arrangement in which, in the arrangement according to embodiment 1, filler region 22 between p$^+$ isolation layer 20 and dicing face 25 is made to extend onto first principal surface 15 to cover voltage withstanding structure 13 and active region 14. The other arrangements are the same as those in embodiment 1. Therefore, as in embodiment 1, p$^+$ isolation layer 20 can prevent a depletion layer, spreading around the p-n junction when the IGBT is reverse-biased, from expanding toward dicing face 25 and the damage region around it to allow the IGBT to obtain a sufficiently high reverse breakdown voltage. Elements similar to those in embodiment 1 are denoted with the same reference numerals and signs as those in embodiment 1, and explanations about these are omitted.

Figure 4A:
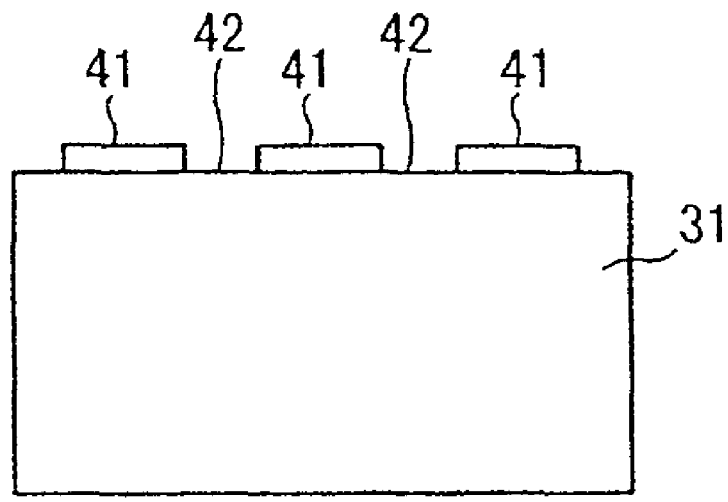
FIG. 4A is a cross sectional view showing the reverse-blocking IGBT shown in FIG. 3 in a state in the course of being manufactured in which state element regions are formed on a silicon wafer.

Next, a manufacturing process of the reverse-blocking IGBT with the arrangement shown in FIG. 3 will be explained with reference to FIG. 4A to FIG. 4D. The details in each of the manufacturing steps are as were explained in embodiment 1. Therefore, redundant explanations will be omitted and only a rough flow of the process is explained here. First, by following well-known steps, the element top surface structure in active region 14 and voltage withstanding structure 13 are formed on first principal surface 15 of silicon wafer 31 (FIG. 4A). At this time, however, an aluminum electrode to be emitter electrode 8 is not yet formed. In FIG. 4A, reference numeral 41 denotes an element region including the element top surface structure in active region 14 and voltage withstanding structure 13, and a region between element region 41 and another element region 41 is separation region 42

Figure 4B:
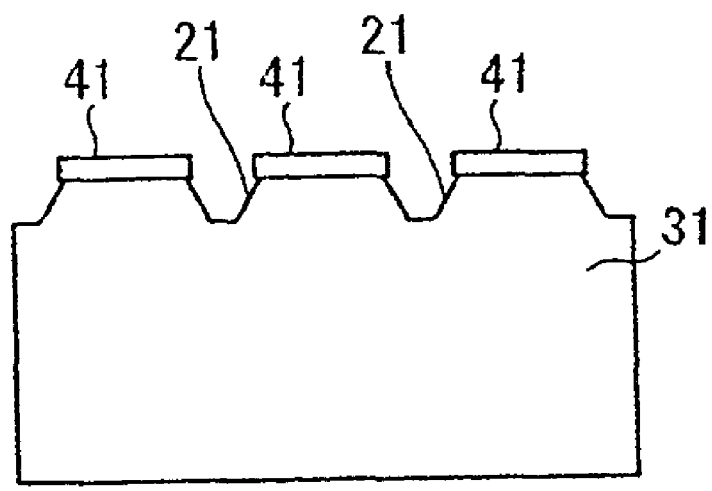
FIG. 4B is a cross sectional view showing the reverse-blocking IGBT shown in FIG. 3 in a state in the course of being manufactured at the step next to that shown in FIG. 4A in which state trenches are formed on the silicon wafer.
Figure 4C:
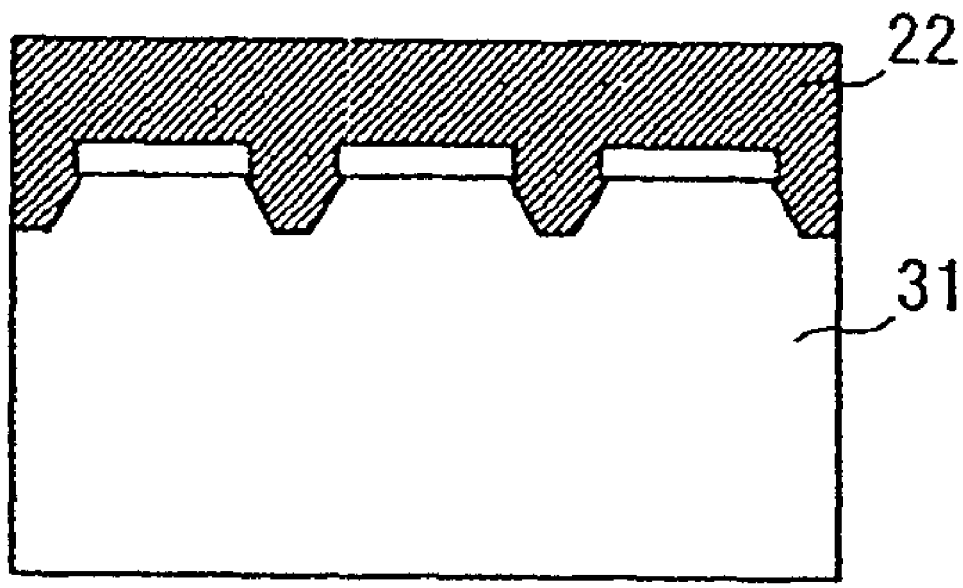
FIG. 4C is a cross sectional view showing the reverse-blocking IGBT shown in FIG. 3 in a state in the course of being manufactured at the step next to that shown in FIG. 4B in which state an insulator film or a semiconductor film is deposited to fill the trench before being annealed.
Figure 4D:
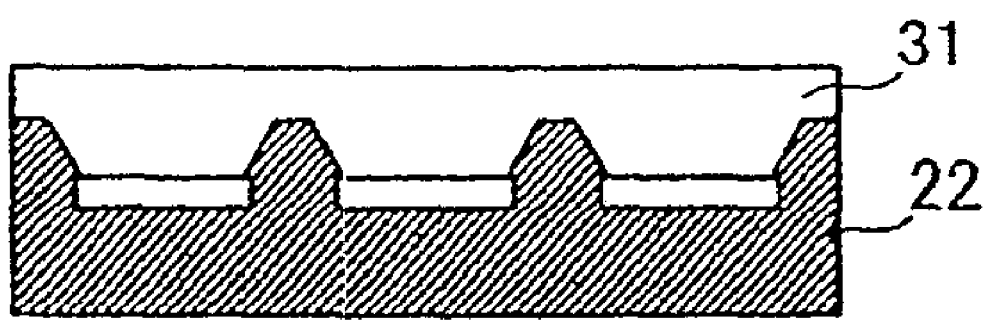
FIG. 4D is a cross sectional view showing the reverse-blocking IGBT shown in FIG. 3 in a state in the course of being manufactured at the step next to that shown in FIG. 4C in which state the silicon wafer is thinned with its second principal surface ground and etched.

Subsequent to this, wet anisotropic etching of silicon is carried out with an alkaline solution to form trench 21 in separation region 42. Then, into the side wall of trench 21, boron atoms, for example, are introduced by ion implantation. Thereafter, on the side of first principal surface 15, aluminum is sputtered and etched to be formed into emitter electrode 8 (FIG. 4B). After this, on the side of first principal surface 15, an insulator film of a material such as SOG, BPSG, polysilazine or polyimide, or a semiconductor film of a material such as polysilicon or epitaxial silicon is deposited to fill trench 21 with the insulator film or the semiconductor film before annealing treatment is carried out (FIG. 4C). At this point, the step of forming $p^+$ isolation layer 20 is completed. Thereafter, second principal surface 16 is ground and etched to thin the wafer (FIG. 4D). After this, on the side of second principal surface 16, $p^+$ collector layer 3 and collector electrode 9 are formed. Finally, the wafer is cut into individual chips by cutting processing such as dicing to complete manufacturing of the devices.

Thus, the processing of forming trench 21 by wet anisotropic etching is processing that causes no damage, with a processing temperature being as low as 200° C. or below. Therefore, trench 21 can be formed in the step after most of a processes of forming the element top surface structure are finished, such as the step after a MOS gate structure is formed on the side of first principal surface 15, the step after emitter electrode 8 of aluminum is formed or the step after a surface protection film such as BPSG is formed, that is, in the latter half of the device manufacturing process. Moreover, by filling trench 21 with the insulator film or the semiconductor film, silicon wafer 31 is prevented from being separated into individual chips or being cracked at trench 21 when the bottom surface of silicon wafer 31 is ground to be a thin wafer.

According to embodiment 1 or 2, it is not necessary to thicken etching mask 32 when trench 21 is formed. Hence, masking oxide film 30 to be etching mask 32 can be formed by carrying out thermal oxidation at a temperature lower than that in a related method and for a time shorter than that in the related method. This can reduce the problem of increasing lead time and the problem of causing crystal defects due to oxygen introduction at oxidation. Moreover, in wet anisotropic etching with an alkaline solution, with an etching rate that is very high, etching can be carried out in a batch process. This is very effective in lead time reduction and in cost reduction.

Also in the wet anisotropic etching with an alkaline solution, the etching temperature is as low as 200° C. or below. This causes a very small thermal load that exerts no influence on the dopant profile of active region 14. Moreover, even though a metal having a comparatively low melting point such as aluminum and a material having poor heat resistance are formed on silicon wafer 31 before trench 21 is formed by the wet anisotropic etching, the etching exerts no influence on the metal and the material.

Furthermore, by carrying out implantation of boron ions into the side wall of trench 21, the heat treatment temperature can be lower than that in a related method and the heat treatment time can be shorter than that in a related method. This gives an effect of reducing a lead time for forming $p^+$ isolation layer 20 and consequently of improving the rate of acceptable products. In addition, a taper angle of the side wall of trench 21 is very large compared with that of the trench formed by dry etching. This can reduce adverse effects such as reduction in an effective dose, loss of dose due to presence of a screen oxide film, loss of dose due to reflection and re-emission of an ion beam, and reduction in effective projected range. Furthermore, with the taper angle of the side wall of trench 21 being very large, chemical and resist residues left in trench 21 can be easily removed, which is very effective in enhancing yield and improving reliability.

Moreover, there is no variation in the taper angle of the side wall of the trench 21, so that variations in dose and in ranges of implanted ions at ion implantation become far small. Further, when trench 21 of V-shape is formed, the depth of trench 21 is determined by the opening width of etching mask 32. This is effective in making variation in the depth of trench 21 much smaller than that of a trench formed by a related method.

Embodiment 3

Figure 10:
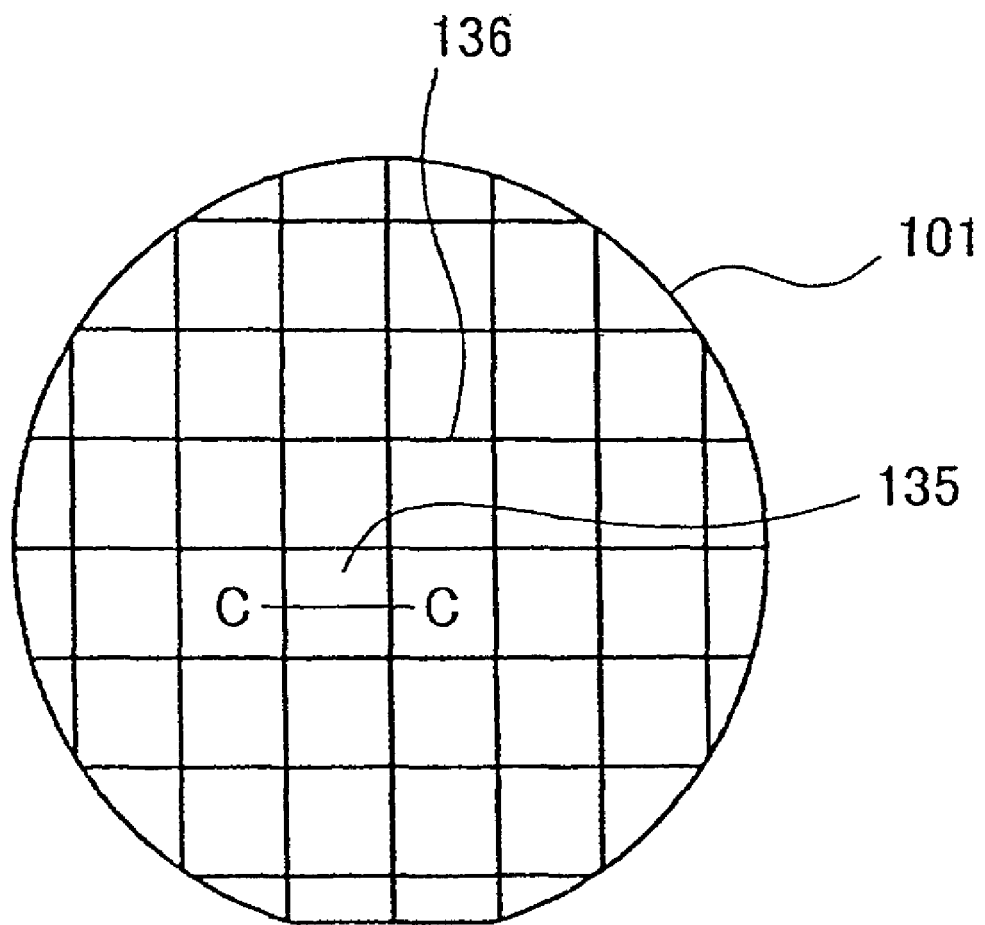
FIG. 10 is a plan view showing an arrangement of a thin semiconductor wafer in which a number of semiconductor chip forming areas of the semiconductor devices according to the invention are integrated.
Figure 11:
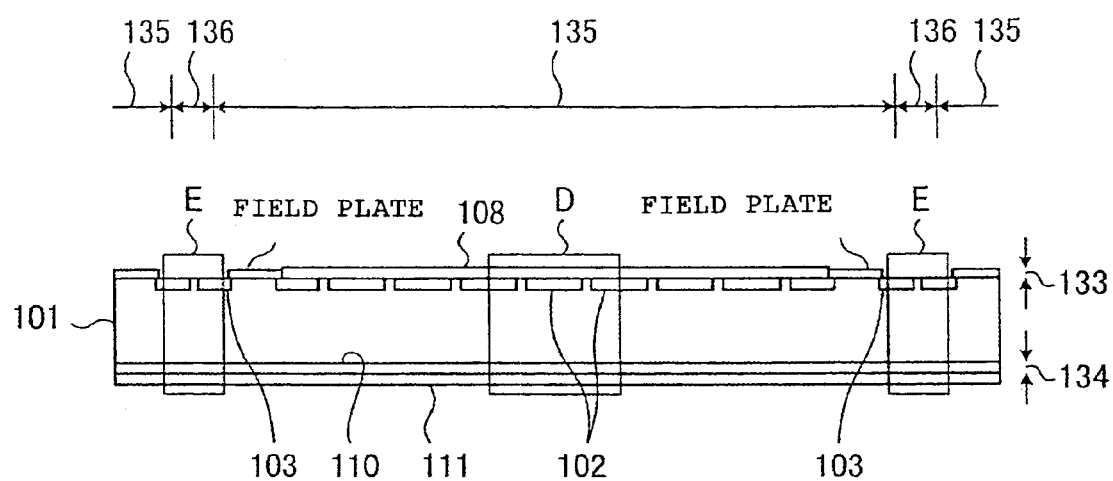
FIG. 11 is a cross sectional view showing an arrangement of a principal part of the semiconductor chip forming area cut on line C-C in FIG. 10.
Figure 12:
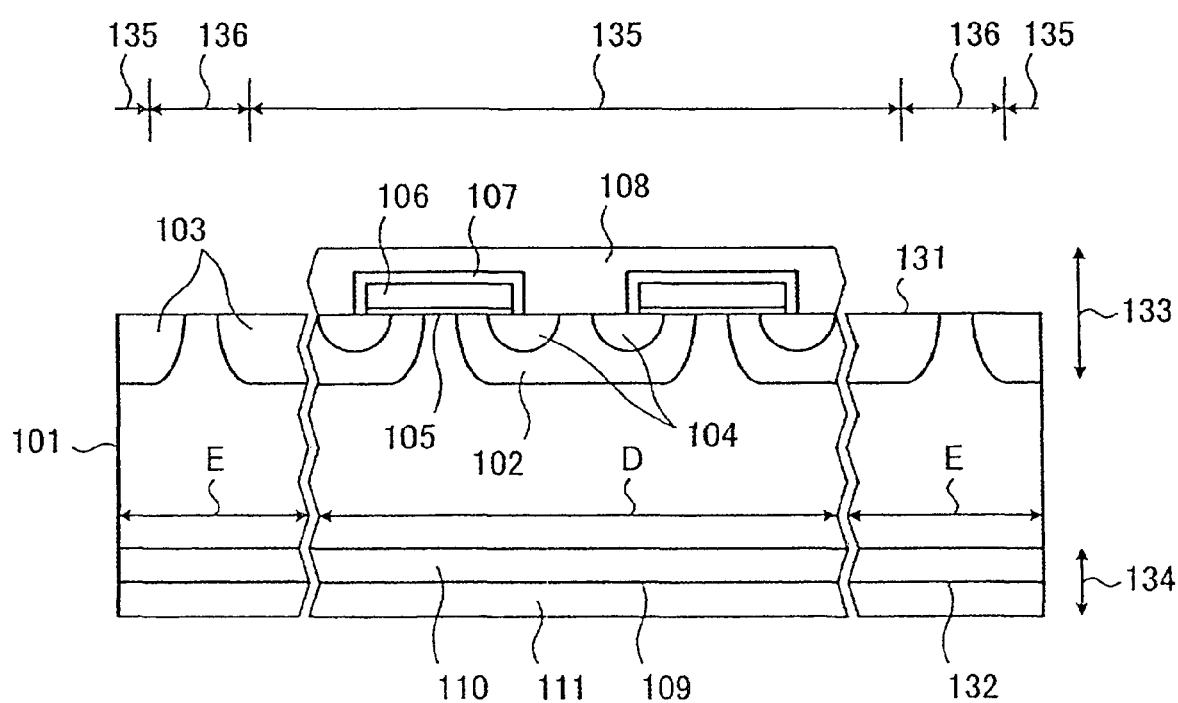
FIG. 12 is an enlarged cross sectional view showing arrangements of the section D and the section E in FIG. 11.

FIG. 10 is a plan view showing an arrangement of a thin semiconductor wafer in which a number of semiconductor chip forming areas of the semiconductor devices (here, reverse-blocking IGBTs) according to the invention are integrated. FIG. 11 is a cross sectional view showing an arrangement of a principal part of the semiconductor chip forming the area cut on line C-C in FIG. 10. FIG. 12 is an enlarged cross sectional view showing arrangements of the section D and the section E in FIG. 11. The thin semiconductor wafer is shown with the second principal surface of a thick semiconductor wafer, on the first principal surface of which a top surface structure is formed, being ground and with a bottom surface structure being formed on the ground second principal surface. No trench to be the scribing line and no isolation layer to be formed in the trench are therefore formed yet.

In IGBT chip forming area 135 on the side of first principal surface 131 of thin semiconductor wafer 101, diffused layers such as p well region 102, p voltage withstanding region 103 and n emitter region 104 are formed. On a channel region of p well region 102, gate electrode 106 is formed with gate insulator film 105 in between. On gate electrode 106, interlayer insulator film 107 is formed. On n emitter region 104 and p well region 102 (on a p contact region with a high impurity concentration that is not shown), emitter electrode 108 is formed, on the surface of which a protection film of a material such as polyimide is formed (not shown). A structure with these constituents is referred to as top surface structure 133. On second principal surface 132 of thin semiconductor wafer 101, p collector region 110 is formed, on which collector electrode 111 is formed. A structure including p collector region 110 and collector electrode 111 is referred to as bottom surface structure 134. P voltage withstanding region 103 is a diffused layer connected to a field plate.

Figure 13:
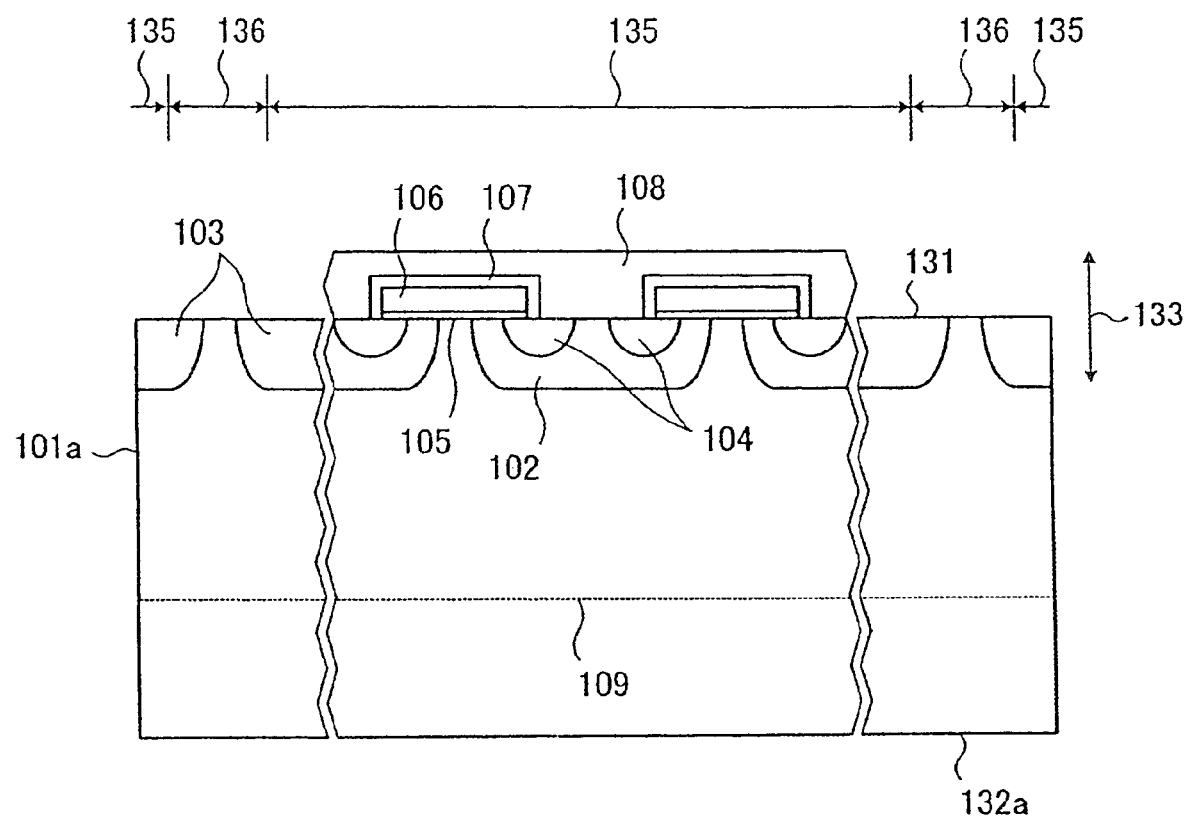
FIG. 13 is a cross sectional view showing a principal part of a reverse-blocking IGBT in a state in the course of being manufactured by a manufacturing method according to embodiment 3 of the invention in which state a top surface structure is formed on a semiconductor wafer.

FIG. 13 to FIG. 18 are cross sectional views showing a method of manufacturing the reverse-blocking IGBT according to embodiment 3 of the invention in the order of manufacturing steps with the IGBT presented by its principal part. In IGBT chip forming area 135 on the side of first principal surface 131 of thick semiconductor wafer 101a with a thickness of the order of 300 μm, for example, diffused layers such as p well region 102, p voltage withstanding region 103 and n emitter region 104 are formed. On the channel region of p well region 102, gate electrode 106 is formed with gate insulator film 105 in between. On gate electrode 106, interlayer insulator film 107 is formed. On n emitter region 104 and p well region 102 (on the p contact region with a high impurity concentration that is now shown), emitter electrode 108 is formed. Over the constituents thus formed, a protection film of a material such as polyimide is formed (not shown). The structure with these constituents becomes top surface structure 133 (FIG. 13).

Figure 14:
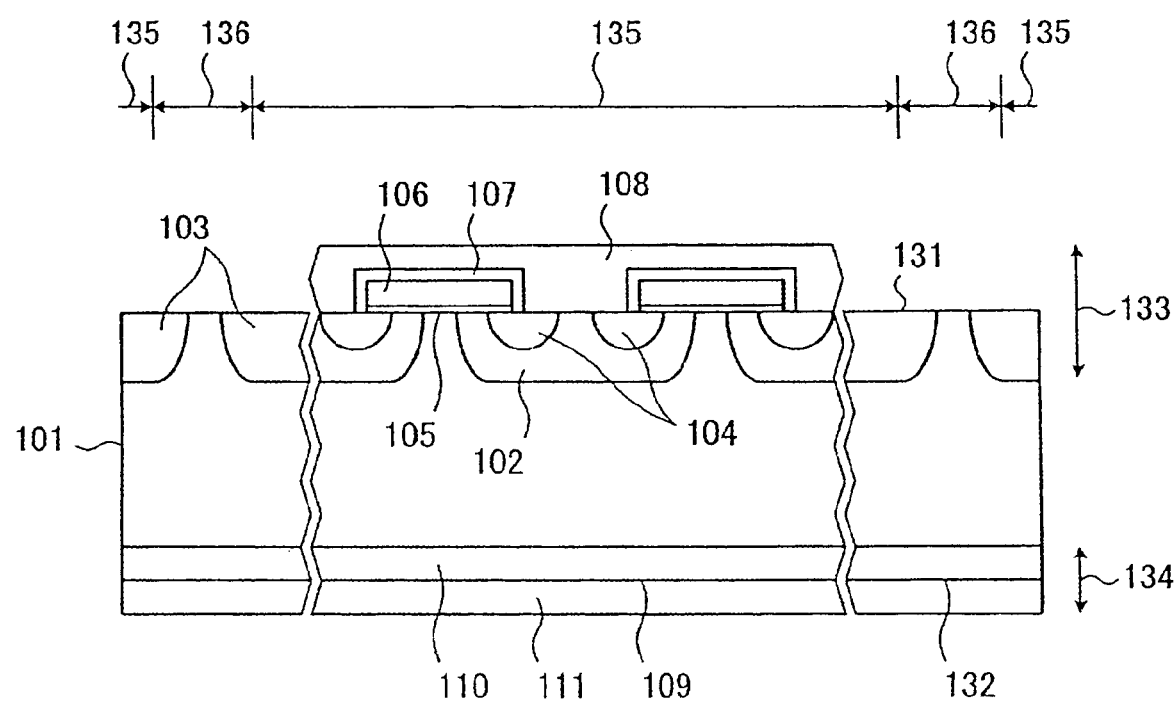
FIG. 14 is a cross sectional view showing a principal part of the reverse-blocking IGBT in a state in the course of being manufactured by the manufacturing method according to embodiment 3 of the invention at the step next to that shown in FIG. 13 in which state a second principal surface of the semiconductor wafer is ground on which a bottom surface structure is formed.

Next, second principal layer 132a of thick semiconductor wafer 101a is ground and etched to be provided as ground surface 109 of thick semiconductor wafer 101a with a thickness of the order of 100 μm. Ground surface 109 becomes second principal surface 132 of thin semiconductor wafer 101. On the side of ground surface 109, p collector region 110 is formed, on which collector electrode 111 is formed. The structure with these constituents becomes bottom surface structure 134. Thin semiconductor wafer 101 with its manufacturing steps up to this point have been completed is prepared (FIG. 14).

Subsequent to this, collector electrode 111 of thin semiconductor wafer 101 is affixed onto supporting substrate 141 formed of a material such as quartz glass (a glass wafer) with double-sided adhesive tape 137 in between. At this time, thin semiconductor wafer 101 and supporting substrate 141 with double-sided adhesive tape 137 are affixed to each other by applying pressures on both thin semiconductor wafer 101 side and supporting substrate 141 side, or by applying a roller so that no air-bubbles are contained between affixed faces.

Figure 15:
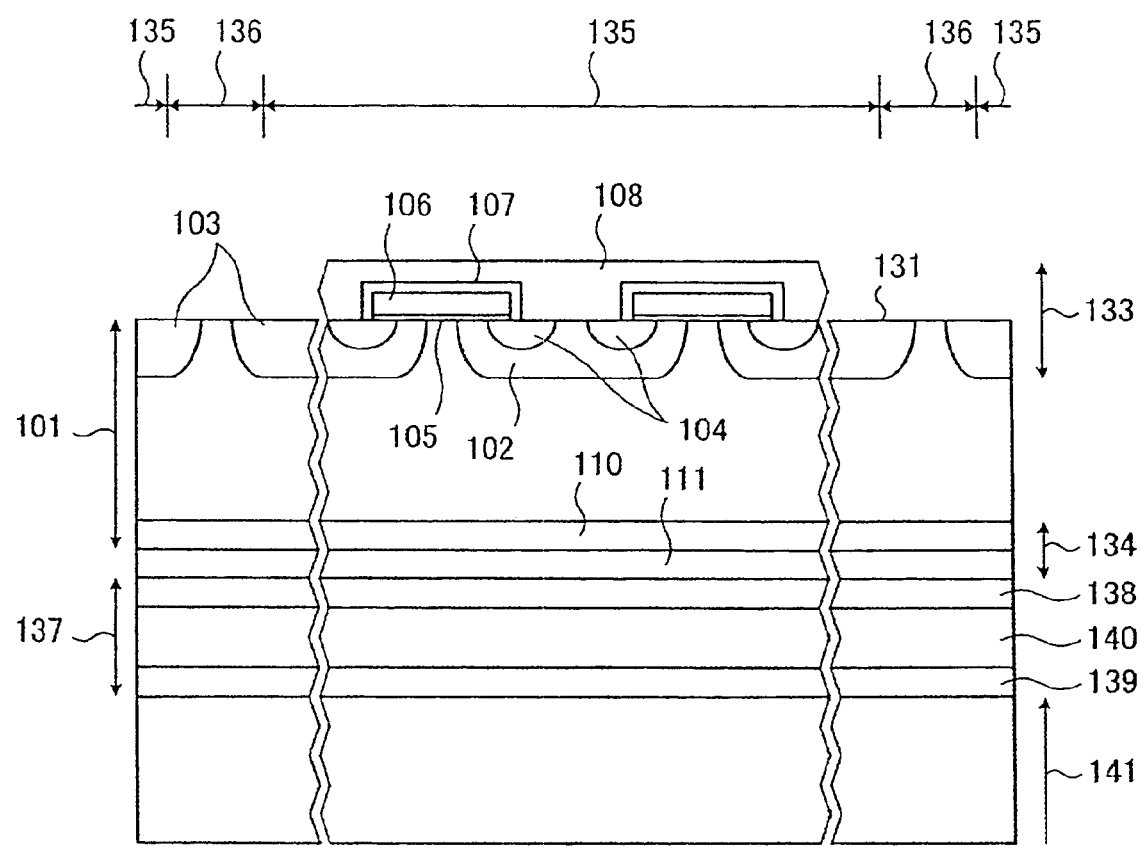

Double-sided adhesive tape 137 has a structure in which thermal foaming tape 138 that is foamed to become removable upon heating and UV (Ultraviolet) tape 139 that becomes removable upon irradiation with ultraviolet light, for example, are affixed with PET (Polyethylene Terephthalate) film 140 in between. Collector electrode 111 of thin semiconductor wafer 101 is affixed to thermal foaming tape 138, supporting substrate 141 is affixed to UV tape 139 (FIG. 15). Although not particularly limited, each of thermal foaming tape 138 and UV tape 139 has a thickness of 50 μm and PET film 140 has a thickness of 100 μm, for example. Moreover, the supporting substrate has a thickness of 600 μm, for example.

Figure 16:
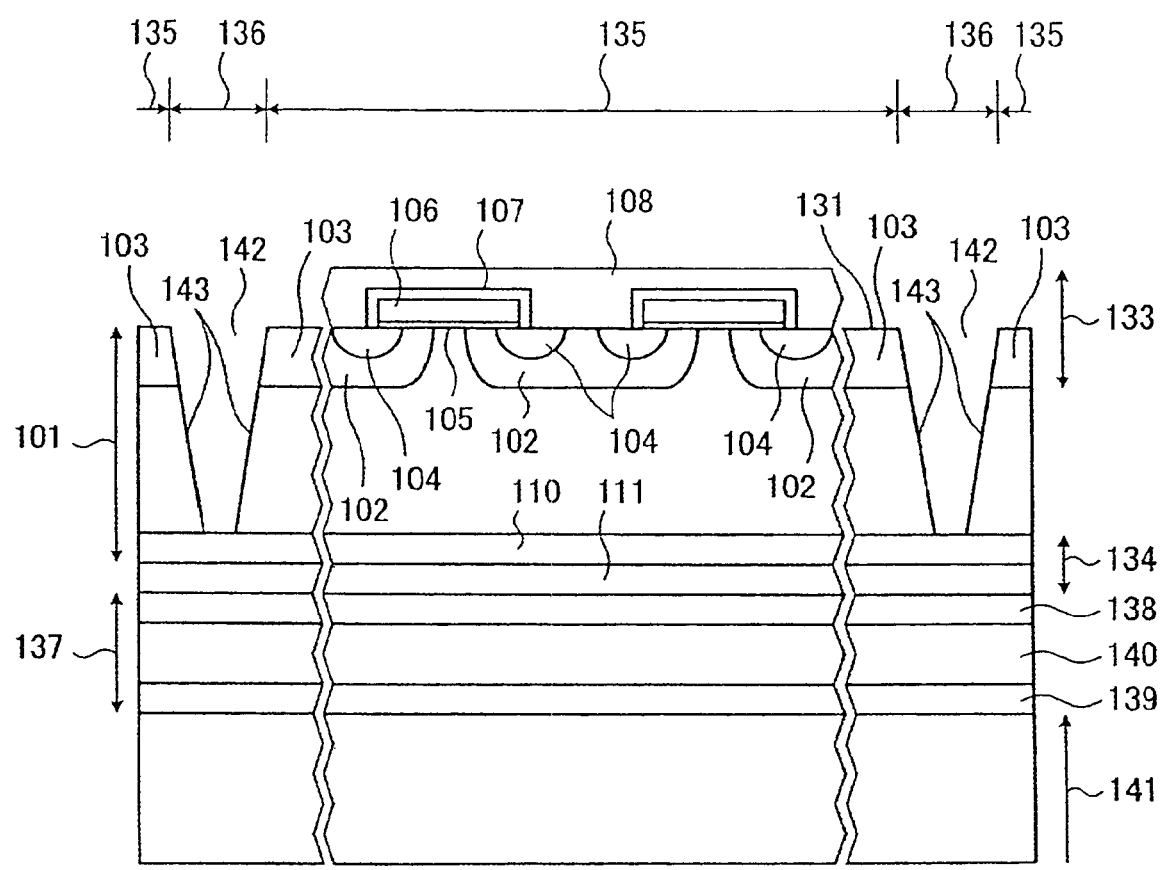
FIG. 16 is a cross sectional view showing a principal part of the reverse-blocking IGBT in a state in the course of being manufactured by the manufacturing method according to embodiment 3 of the invention at the step next to that shown in FIG. 15 in which state a trench is formed in the semiconductor wafer.

Next to this, between adjacent IGBT chip forming areas 135 in thin semiconductor wafer 101, trench 142 to be scribing line region 136 is formed by wet anisotropic etching (FIG. 16). The bottom of trench 142 reaches p collector region 110. In this state, even though trench 142 is formed, thin semiconductor wafer 101, being secured to supporting substrate 141 with double-sided adhesive tape 137 in between, is not separated into semiconductor chips. The side wall of the trench becomes an edge of an IGBT chip.

Requirements of an etching solution for forming trench 142 are 3 to 20% in concentration and 50 to 90° C. in temperature in a TMAH (tetramethylammonium hydroxide) aqueous solution. Moreover, requirements can be 1 to 20% in concentration and 50 to 90° C. in temperature in an $NH_4OH$ (ammonia) aqueous solution, and can be 10 to 60% in concentration and 50 to 90° C. in temperature in a KOH (potassium hydroxide) aqueous solution.

Figure 19:
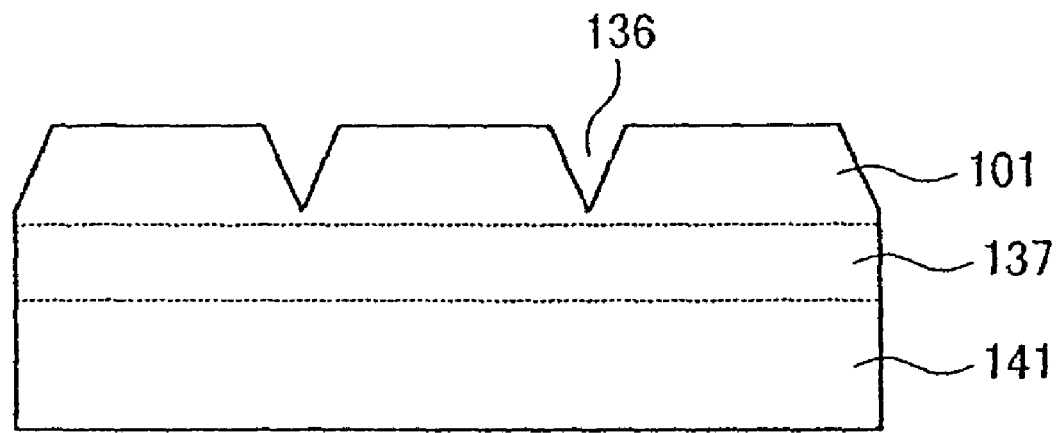
FIG. 19 is a cross sectional view showing a principal part of the reverse-blocking IGBT in a state in the course of being manufactured by the manufacturing method according to embodiment 3 of the invention in which state a V-shaped scribing line region is formed as the trench.
Figure 20:
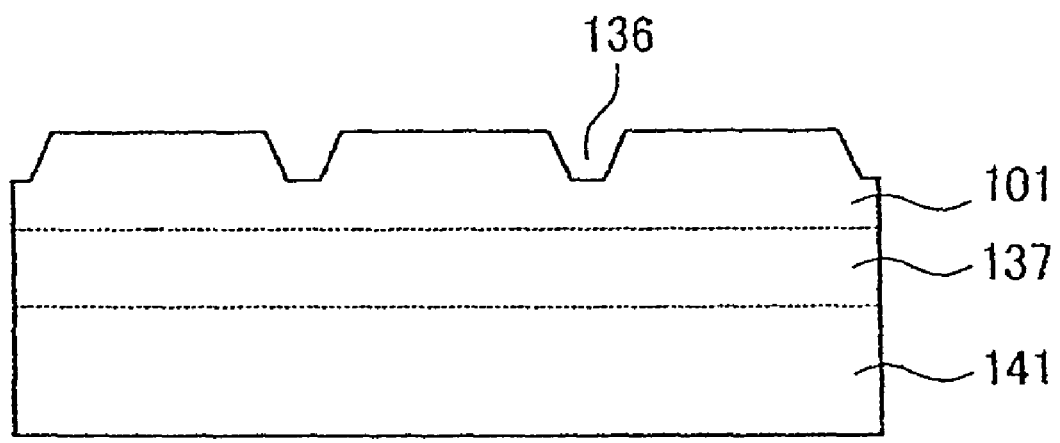
FIG. 20 is a cross sectional view showing a principal part of the reverse-blocking IGBT in a state in the course of being manufactured by the manufacturing method according to embodiment 3 of the invention in which state an inverted-trapezoid-shaped scribing line region is formed as the trench.

Trench 142 thus formed has a shape as explained with reference to FIG. 5 to FIG. 9 in embodiment 1 because first principal surface 131 of thin semiconductor wafer 101 is the (100) plane. The flatness of the (111) plane etched by the wet anisotropic etching is of the order of 1 nm Ra with which the plane becomes a very smooth plane. As shown in FIG. 19, in the case in which etching is naturally stopped to provide scribing line region 136 as a trench with a V-shaped cross section, the bottom of the V-shape of scribing line region 136 being made so as to touch p collector region 110. Moreover, as shown in FIG. 20, in the case in which etching is stopped halfway to provide scribing line region 136 as a trench with an inverted-trapezoid-shaped cross section, the bottom of the inverted-trapezoid-shape of scribing line region 136 is made so as to touch p collector region 110.

Figure 17:
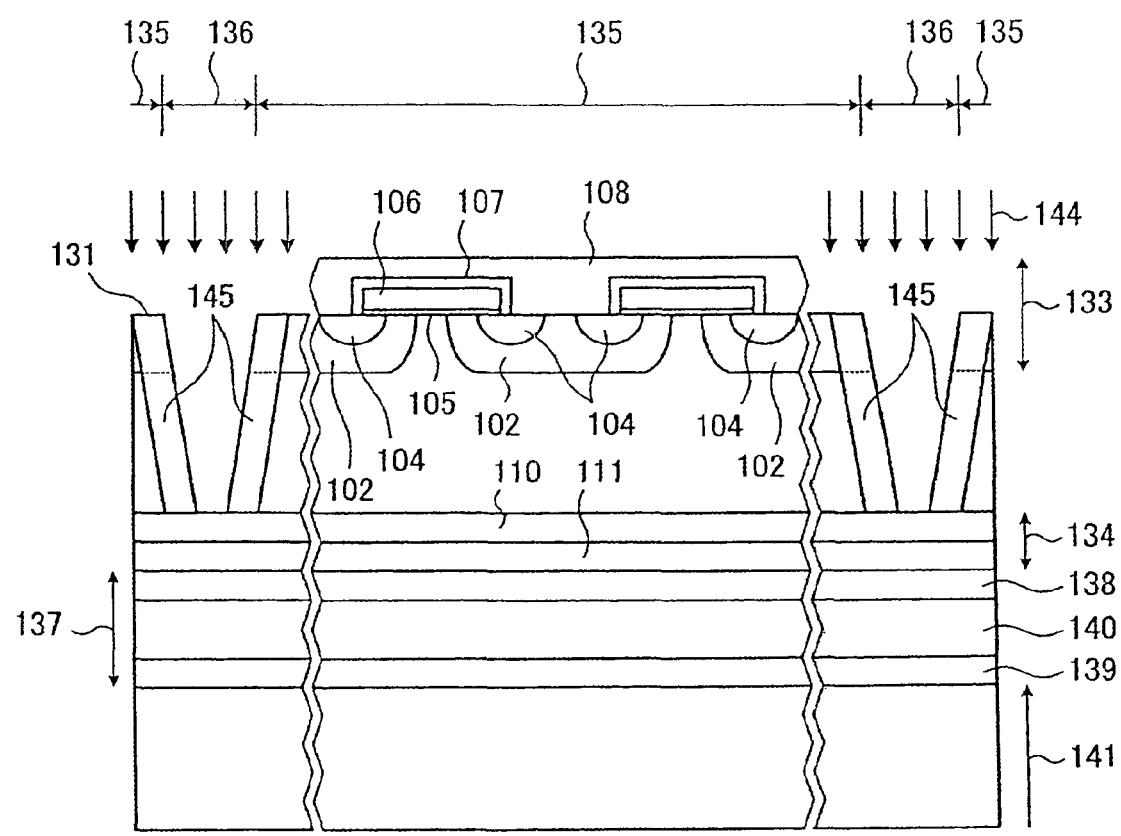
FIG. 17 is a cross sectional view showing a principal part of the reverse-blocking IGBT in a state in the course of being manufactured by the manufacturing method according to embodiment 3 of the invention at the step next to that shown in FIG. 16 in which state an isolation layer is formed on the side wall of the trench.
Figure 18:
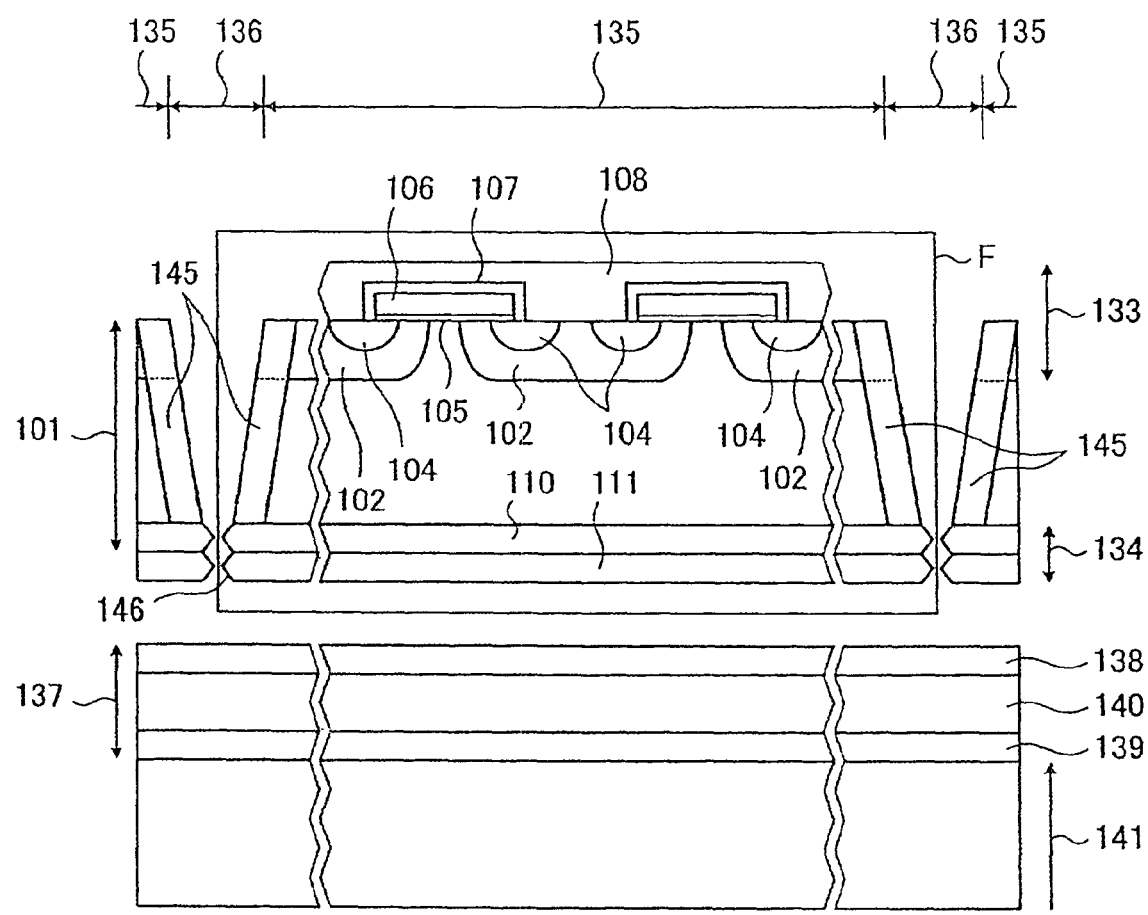
FIG. 18 is a cross sectional view showing a principal part of the reverse-blocking IGBT in a state in the course of being manufactured by the manufacturing method according to embodiment 3 of the invention at the step next to that shown in FIG. 17 in which state the semiconductor wafer is removed from the double-sided adhesive tape to be separated into IGBT chips.

Following this, ion implantation 144 with boron ions is carried out from the side of first principal surface 131 of thin semiconductor wafer 101 onto the sidewall of trench 142. Then, low temperature annealing is carried out to activate the implanted boron ions, by which isolation layer 145 is formed (FIG. 17). In forming isolation layer 145, as in the ion implantation into a vertical trench side wall, the ion implantation can be carried out by dividing the implantation process into four steps, each being carried out for the side wall in each of the four directions around a chip with the wafer being inclined in each step. However, since the taper angle (an angle of intersection) of side wall surface 143 of trench 142, into which surface ion implantation is carried out, to first principal surface 131 is as large as about 125.3°, ion implantation can be carried out without inclining the wafer (at a tilt angle of 0° (vertically)). In this case, only once ion implantation is sufficient, so that the process can be simplified (FIG. 16 to FIG. 18).

In forming a trench by dry etching in the related art, a high aspect ratio of the trench caused reduction in an effective dose, a loss of dose due to presence of a screen oxide film, loss of a dose due to reflection and re-emission of an ion beam, and reduction in an effective projected range. In the trench according to the invention, however, no such problems are caused because the taper angle of the side wall surface of the trench to the first principal surface is large as 125.3° and the aspect ratio is small. Furthermore, the small aspect ratio facilitates removal of chemical and resist residues in the trench, and this is very effective in enhancing yield and improving reliability. The taper angle of the V-shaped trench is fixed at 54.7° of an angle of intersection of the principal surface (the second principal surface) of the (100) plane and the (111) plane at which etching is stopped. This causes no variation in the taper angle of the side wall. Hence, variations in dose and ranges of implanted ions at ion implantation become very small.

As an example, the case is given in which boron ions are implanted at $1\times10^{15}/cm^{-2}/100$ keV at a tilt angle of 0°. A temperature and a time for low temperature annealing carried out after the ion implantation are those which exert no influence on the emitter electrode and the collector electrode that already are formed (at an annealing temperature of 400° C. for an annealing time of 5 hours, for example). Moreover, the flatness of 1 nm Ra of side wall surface 143 of the 142 can ensure formation of isolation layer 145 with a diffusion depth of 1 μm.

Subsequent to this, thin semiconductor wafer 101, affixed onto supporting substrate 141 with double-sided adhesive tape 137, is heated to carry out thermal foaming removal of thermal foaming tape 138 from thin semiconductor wafer 101, by which means semiconductor wafer 101 is separated from double-sided adhesive tape 137 affixed to supporting substrate 141. Moreover, by irradiating UV tape 139 with ultraviolet (UV) light, UV tape 139 is removed from supporting substrate 141, by which means double-sided adhesive tape 137 is separated from supporting substrate 141 so that it can reused. IGBT forming regions 135 are coupled to each other by thin bottom surface structure 134 with a thickness of several micrometers (a total of the thicknesses of p collector region 110 and collector electrode 111). However, when thermal foaming tape 138 is removed, thin bottom surface structure 134 is broken at the coupling section to separate the IGBT chips from each other (FIG. 18).

Here, the thermally foamed removal of thermal foaming tape 138 is carried out with supporting substrate 141 under semiconductor wafer 101 being put on a hot plate and heated at a raised temperature of the order of 130° C. Since the thickness left at the bottom of trench 142 of semiconductor wafer 101 is only several micrometers as described above, the thermally foamed removal of semiconductor wafer 101 simultaneously allows semiconductor wafer 101 to be separated into chips. When p collector region 110 and collector electrode 111 coupling IGBT forming regions 135 are left without being broken, the remaining coupling section can be cut by such measures as a laser beam. Thus, an IGBT chip shown as F section in FIG. 18 is formed. The IGBT chip is assembled in a package to be completed as a reverse-blocking IGBT (not shown).

According to embodiment 3, thin wafer 101 with top surface structure 133 and bottom surface structure 134 of an IGBT chip being formed is affixed onto supporting substrate 141 with double-sided adhesive tape 137. Thereafter, the formation of trench 142 is carried out, which also serves as the formation of the scribing line. On the side wall of trench 142, isolation layer 145 is formed by implanting impurity ions. By removing double-sided adhesive tape 137 from thin semiconductor wafer 101, the IGBT chip is completed. This causes less contamination of the wafer compared with the related method according to which, after trench 142 is formed, the bottom surface (second principal surface 132) of thick semiconductor wafer 101a is ground and bottom surface structure 134 is then formed. Moreover, no degradation in characteristics due to oxygen is caused unlike the isolation layer formed by the related coating and diffusion method. Hence, a high rate of acceptable products of 90% or more can be stably obtained. In addition, the step of filling the trench with a reinforcing material as was carried out in a related manufacturing process can be omitted, which step was carried out for the semiconductor wafer to be diced into chips. Hence, a reverse-blocking IGBT can be provided at a low cost with high reliability.

Figure 21:
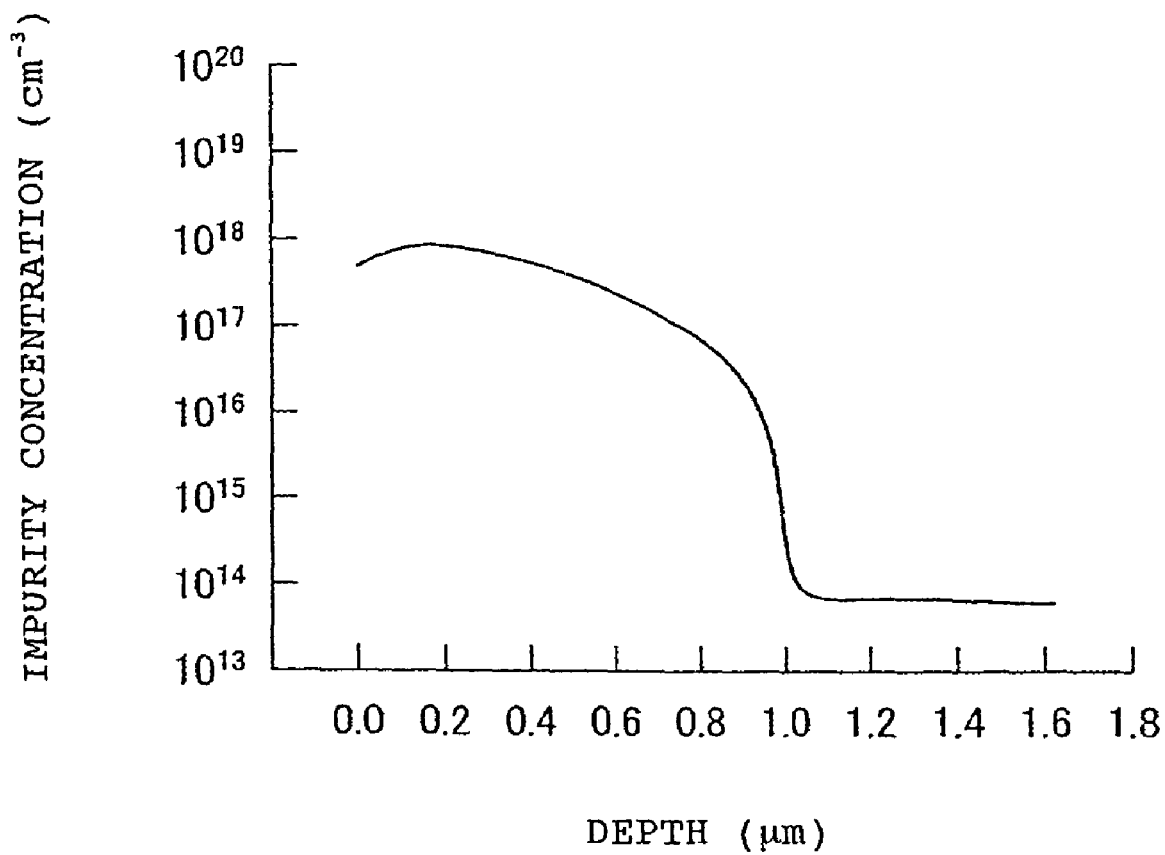
FIG. 21 is a characteristic diagram showing an impurity concentration profile in an isolation layer formed by ion implantation and low temperature annealing.

FIG. 21 is a characteristic diagram showing an impurity concentration profile in an isolation layer formed by ion implantation and low temperature annealing. The impurity concentration profile was measured by the SR (Spreading Resistance) method. The flatness of the side wall of the trench is excellent, at 1 nm Ra. Therefore, even with isolation layer 145 having a diffusion depth of the order of 1 μm with an impurity concentration of the order of $10^{18}$ cm$^{-3}$, a depletion layer can be reliably stopped. Although boron was used as a dopant for forming the above-described isolation layer, aluminum can also be used. In addition, in embodiment 3, UV tape 139 was used for the adhesive tape on the side of supporting substrate 141. However, a removable tape used in an ordinary grinding process (a back-grinding process) can be used which can be removed from supporting substrate 141 by peeling (pulling off).

Embodiment 4

Figure 22:
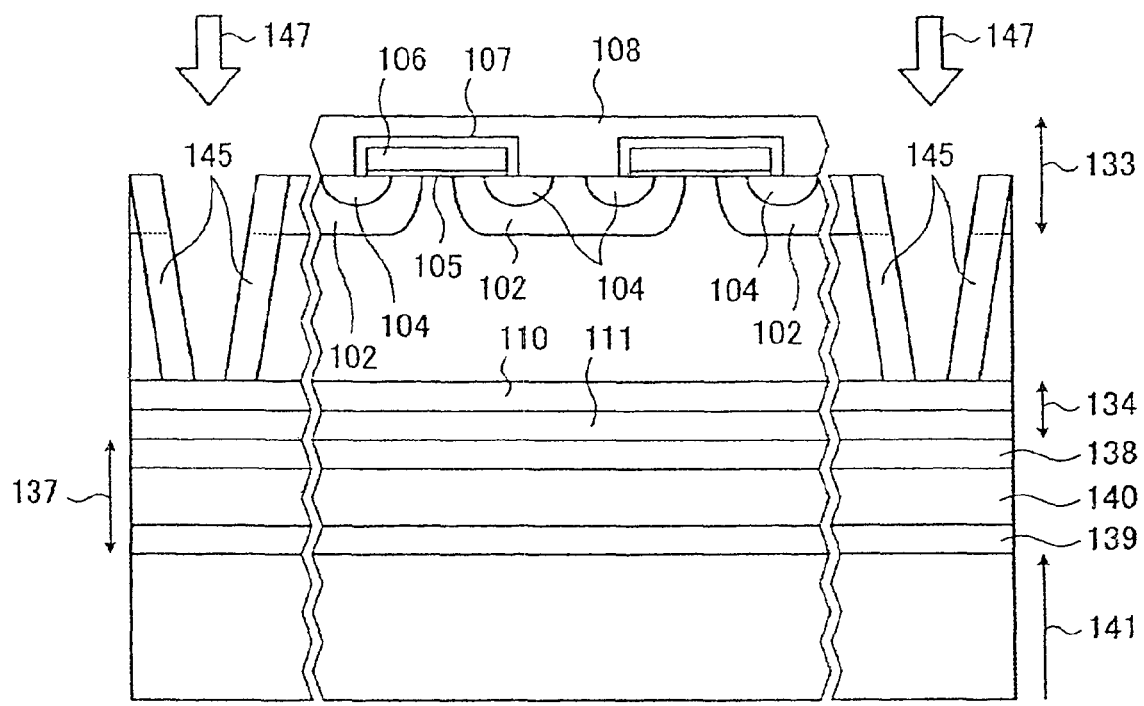
FIG. 22 is a cross sectional view showing a principal part of the reverse-blocking IGBT in a state in the course of being manufactured by a manufacturing method according to embodiment 4 of the invention.

FIG. 22 is a cross sectional view showing a principal part of a reverse-blocking IGBT in a state in the course of being manufactured by a method of manufacturing the reverse-blocking IGBT according to embodiment 4 of the invention. The cross sectional view corresponds to that of FIG. 17. As shown in FIG. 22, embodiment 4 differs from embodiment 3 in that, for forming isolation layer 145, laser annealing 147 is carried out instead of low temperature annealing after ion implantation. The other processes are the same as those in embodiment 3. Elements that are similar to those in embodiment 3 are denoted with the same reference numerals and signs as in embodiment 3, and explanations about these are omitted.

Figure 23:
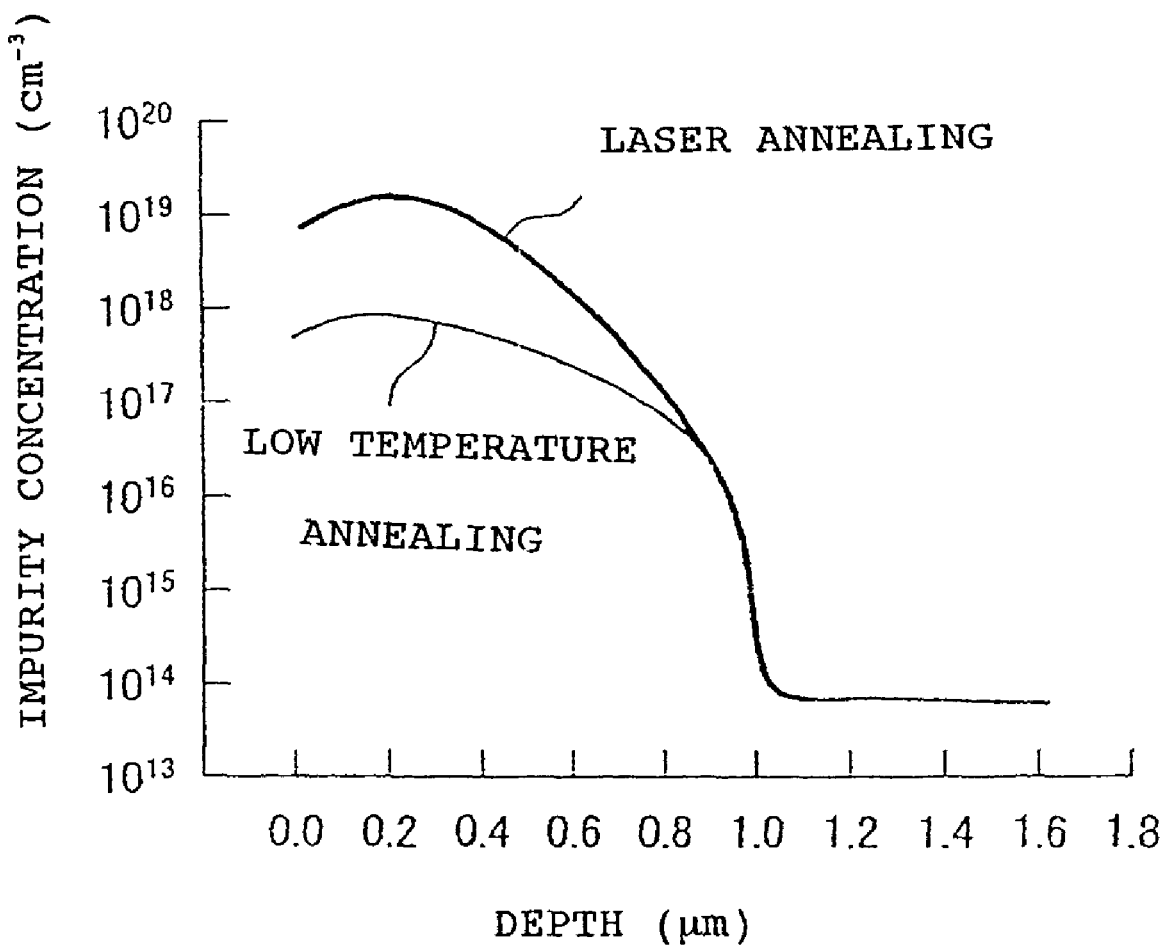
FIG. 23 is a characteristic diagram showing an impurity concentration profile in an isolation layer when the isolation layer was subjected to laser annealing.

FIG. 23 is a characteristic diagram showing an impurity concentration profile in an isolation layer when the isolation layer was subjected to laser annealing. For reference, an impurity concentration profile when the isolation layer was subjected to low temperature annealing is also shown. In the laser annealing, the isolation layer is irradiated with a YAG2ω double-pulse laser (with a total irradiation energy density of 3 J/cm$^2$ from two laser units (1.5 J/cm$^2$+1.5 J/cm$^2$), a wavelength of 532 nm and a delay time of 300 ns between the two laser pulses).

When boron ions as dopant ions implanted into the side wall of the trench are activated under the above conditions, an isolation layer can be obtained with an impurity concentration exceeding 1×10$^{19}$ cm$^{-3}$, and a depth on the order of 1 μm. The resulting isolation layer, being harder to be depleted than an isolation layer obtained in the case when low temperature annealing is used, can enhance the rate of acceptable products about a reverse breakdown voltage. The reason that the impurity concentration becomes higher than that in the case when low temperature annealing is used is that the side wall of the trench is instantaneously heated up to a temperature near the melting point of silicon to enhance activation yield of the dopant ions.

Furthermore, the laser annealing exerts a heat influence only on a region subjected to ion implantation in a section where the isolation layer is formed. Therefore, no thermal load is added again to the device, so that the laser annealing is provided as a good method. The laser annealing can be carried out by laser irradiation onto a part desired to be irradiated with the other parts covered by metal masks of a material such as SUS, or by partial laser irradiation onto the desired part. The partial irradiation laser annealing is a method of partially carrying out annealing by partially scanning with a laser beam or by controlling laser irradiation with a shutter that is opened and closed while laser beam scanning is performed.

Figure 24:
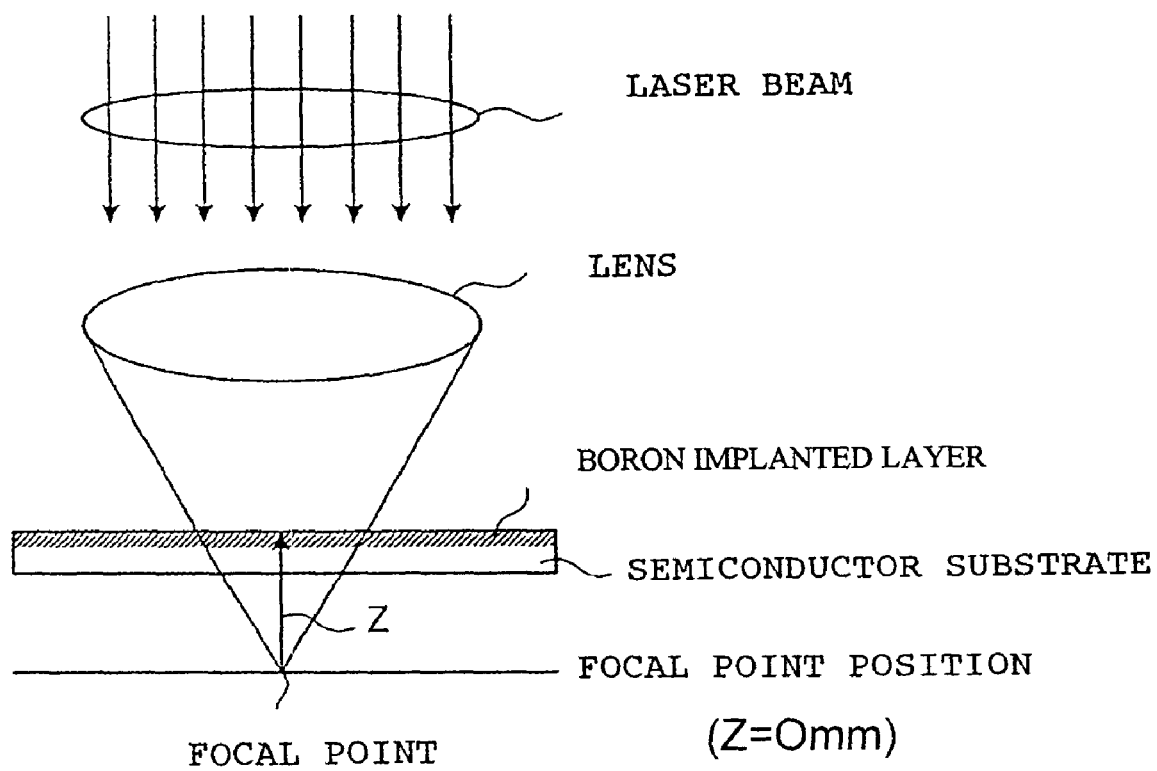
FIG. 24 is a view showing a method of measuring a relationship between an amount of shift Z of the semiconductor substrate from the focal point of a laser beam toward a laser beam source and a peak impurity concentration in the semiconductor substrate.

FIG. 24 is a view showing a method of measuring a relationship between an amount of shift Z of the semiconductor substrate from the focal point of a laser beam toward a laser beam source and a peak impurity concentration in the semiconductor substrate. In the measurement, twenty-one semiconductor substrates were provided into each of which boron ions were implanted with the same dose. The twenty-one semiconductor substrates were divided into three groups and irradiated with a YAG2ω laser for laser annealing. The seven semiconductor substrates in the first group (No. 1 group) were irradiated with an irradiation energy density of the laser beam given as 3.0 J/cm$^2$, the seven semiconductor substrates in the second group (No. 2 group) were irradiated with an irradiation energy density given as 1.5 J/cm$^2$, and the seven semiconductor substrates in the third group (No. 3 group) were irradiated with an irradiation energy density given as 1.2 J/cm$^2$. At irradiation, the seven semiconductor substrates in each group were set at positions (seven positions) with respective amounts of shift Z from the focal point taken as 0 mm, 0.2 mm, 0.4 mm, 0.6 mm, 0.8 mm, 1.0 mm and 1.2 mm. After the laser annealing, the peak impurity concentration in each semiconductor substrate was measured. An explanation of the results will be given below.

Figure 25:
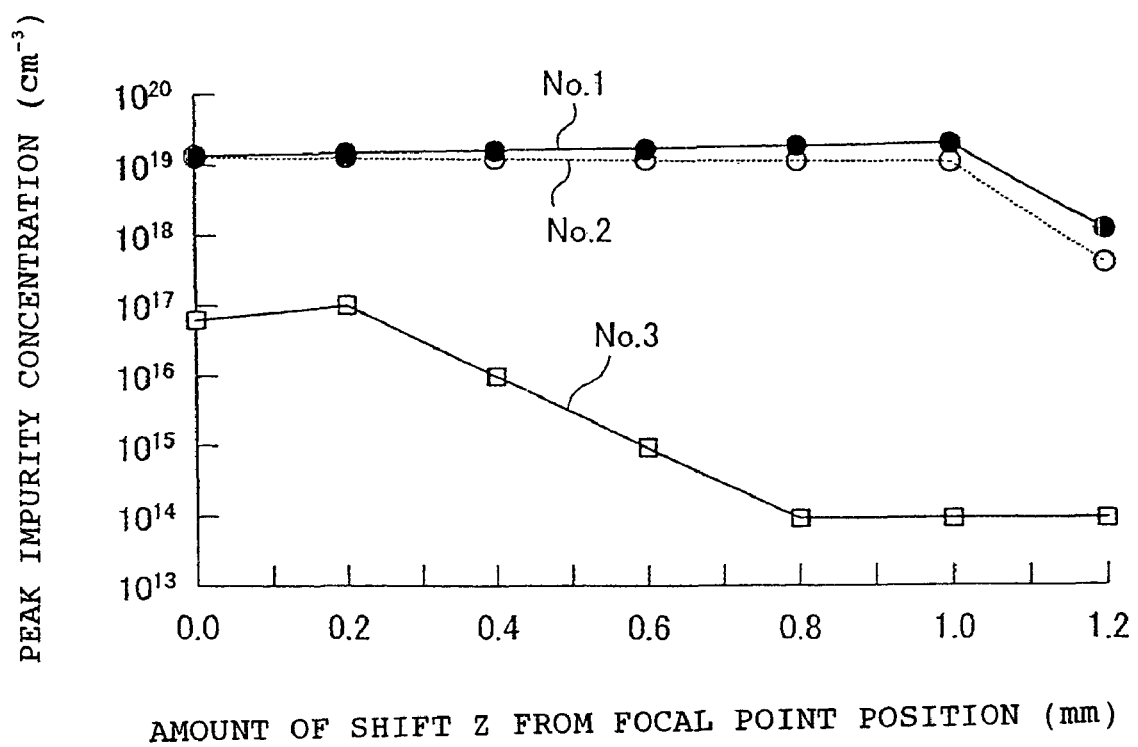
FIG. 25 is a diagram showing a relationship between the amount of shift Z of the semiconductor substrate from the focal point of a laser beam toward a laser beam source and the peak impurity concentration in the semiconductor substrate.

FIG. 25 is a diagram showing a relationship between the amount of shift Z of the semiconductor substrate from the focal point of a laser beam toward a laser beam source and the peak impurity concentration in the semiconductor substrate. From FIG. 25, it is known that the peak impurity concentration varies with a shift from the focal point when the irradiation energy density is 1.2 J/cm$^2$. Moreover, it is known that, with the irradiation energies of 1.5 J/cm$^2$ and 3.0 J/cm$^2$, the impurity concentration is not varied until the shift from the focal point exceeds 1 mm.

In other words, it is known that, in embodiment 4, irradiation with an irradiation energy density of 1.5 J/cm$^2$ or more enables sufficient activation of the layer of implanted impurity ions in the side wall. Therefore, when an isolation layer is formed by ion implantation into the side wall of a trench 1 mm or less in depth to the bottom, irradiation with an irradiation energy density of 1.5 J/cm² or more enables sufficient activation of the implanted impurity ions.

In a reverse-blocking IGBT, for a wafer with a thickness up to 1 mm in which electrical characteristics such as a breakdown voltage can be ensured, an isolation layer can be formed by carrying out this laser annealing. Moreover, for a wafer with a trench less than 10 μm in depth to the bottom, laser annealing has already been used in forming an integrated circuit. Therefore, the laser annealing can be applied to a wafer with a trench between 10 μm and 1 mm in depth to the bottom.

According to embodiment 3 or 4, the adverse effect due to oxygen can be eliminated more than in the case in which the isolation layer is formed by a coating and diffusion method, so that a far more excellent rate of acceptable products (>90%) can be ensured. Moreover, low temperature annealing (embodiment 3) or laser annealing (embodiment 4) used for activating the above-described isolation layer allows the isolation layer to be provided uniformly with a shallow diffusion depth. This can minimize an area of the isolation layer occupying the semiconductor chip to allow device pitch to be reduced. Explanation of embodiment 4 was made by limiting the formation of the isolation layer with laser annealing to the case in which the formation was carried out after the semiconductor wafer was affixed to the supporting substrate with the double-sided adhesive tape. However, the laser annealing technique is also highly effective for a case in which the isolation layer is formed by a method other than the method carried out by affixing the semiconductor wafer to the supporting substrate.

Embodiment 5

Figure 26:
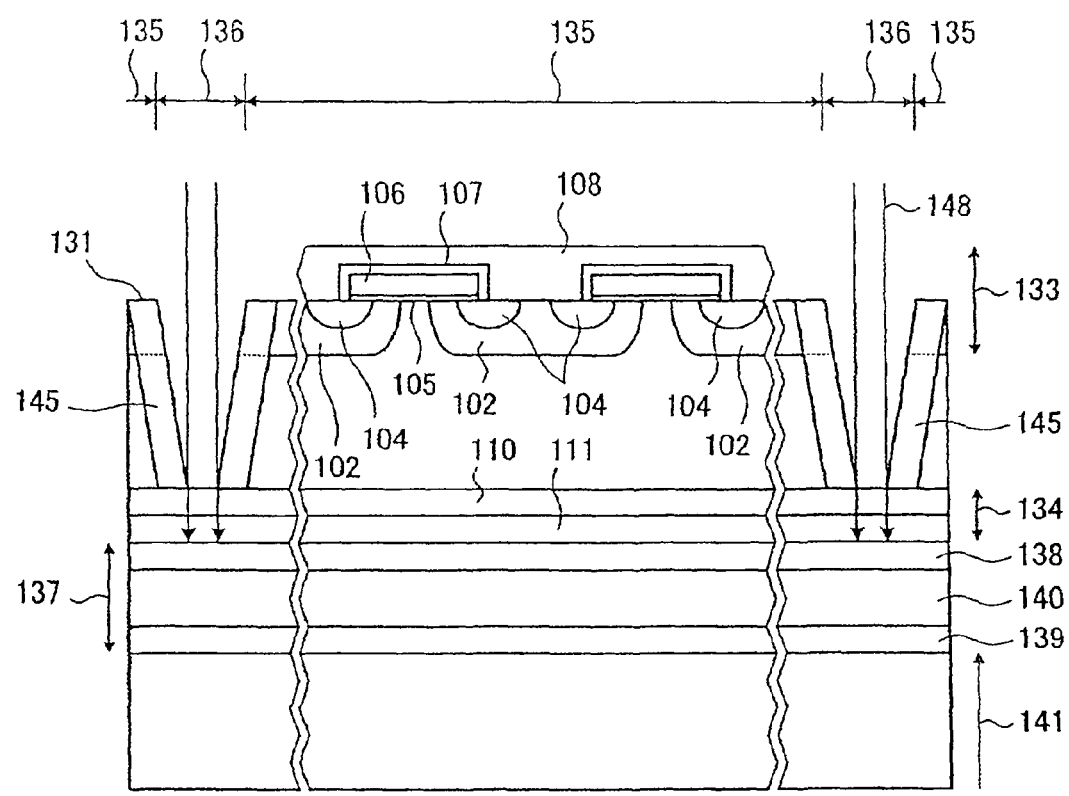
FIG. 26 is a cross sectional view showing a principal part of the reverse-blocking IGBT in a state in the course of being manufactured by the manufacturing method according to embodiment 5 of the invention in which state laser dicing is being carried out.
Figure 27:
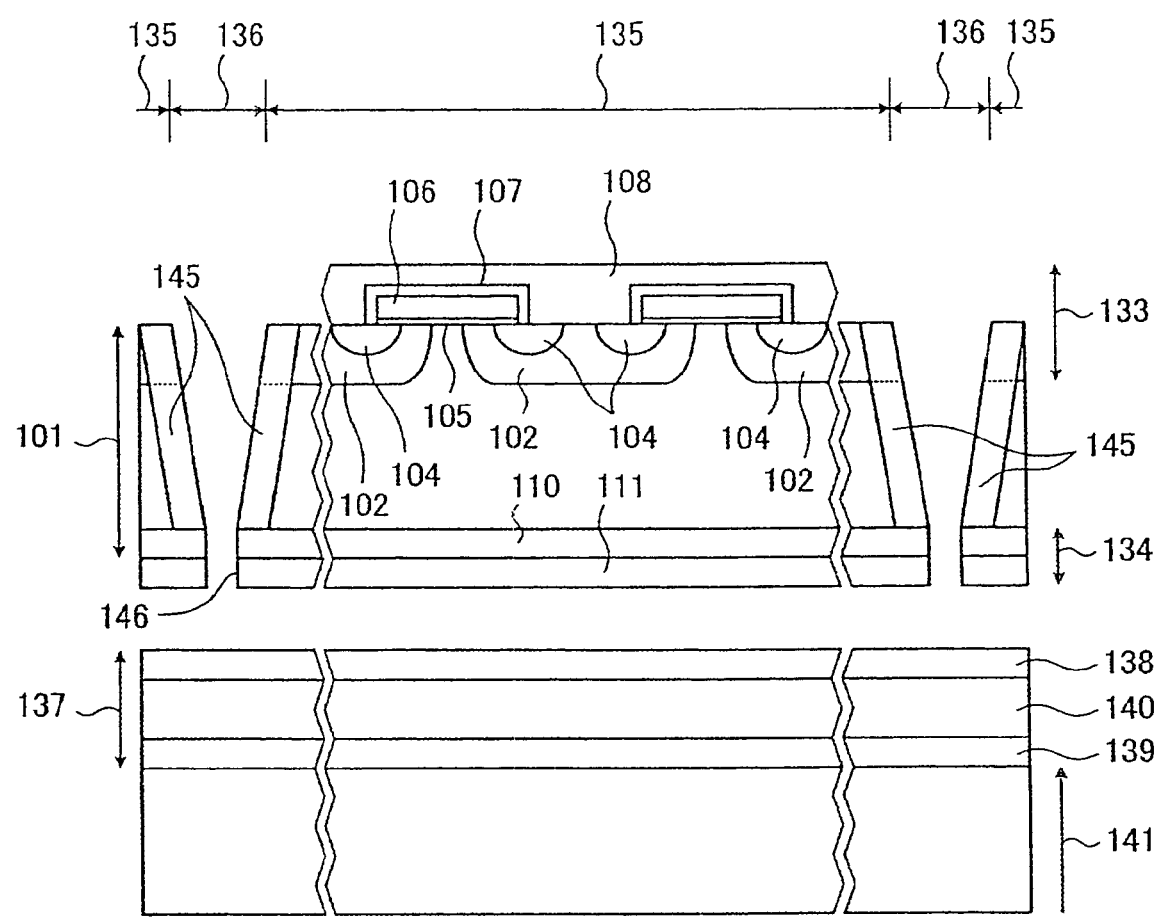
FIG. 27 is a cross sectional view showing a principal part of the reverse-blocking IGBT in a state in the course of being manufactured by the manufacturing method according to embodiment 5 of the invention at the step next to that shown in FIG. 26 in which state the semiconductor wafer is removed from a double-sided adhesive tape to be separated into IGBT chips.
Figure 28A:
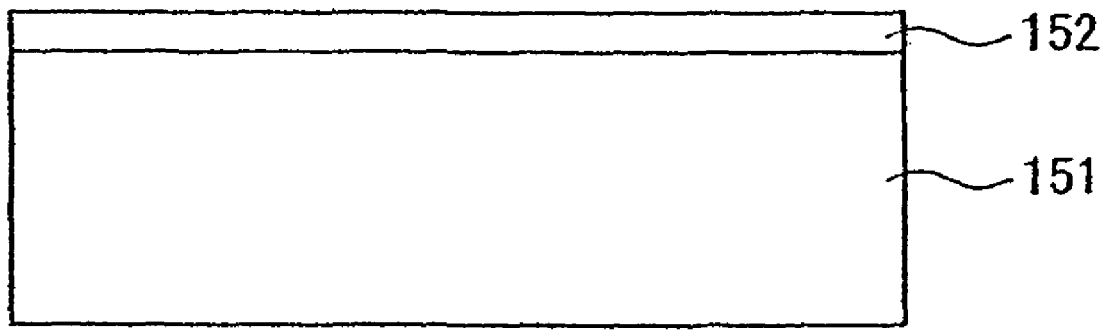
FIG. 28A is a cross sectional view showing a principal part of a related reverse-blocking IGBT in a state in the course of being manufactured by a related manufacturing method in which state an oxide film is formed as a dopant mask on a semiconductor wafer.
Figure 28B:
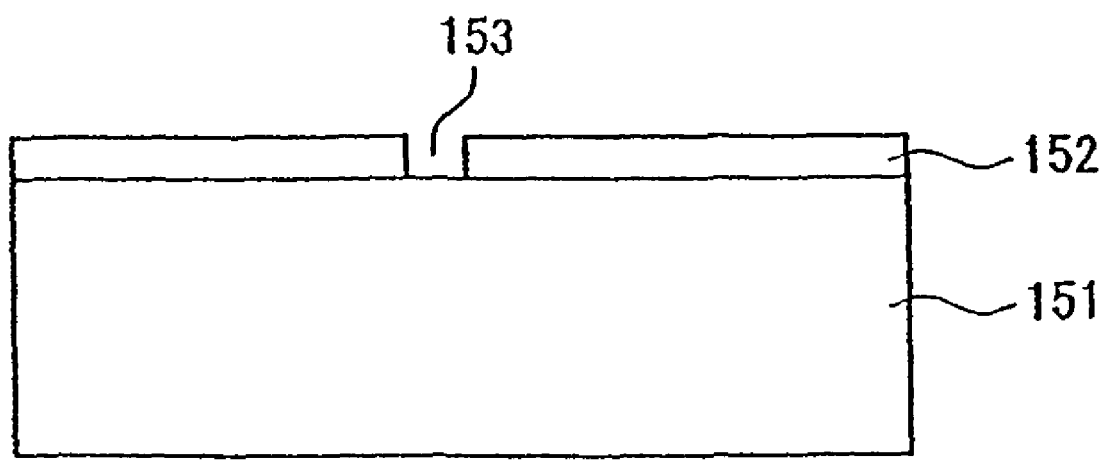
FIG. 28B is a cross sectional view showing a principal part of a related reverse-blocking IGBT in a state in the course of being manufactured at the step next to that shown in FIG. 28A in which state an opening is formed in the oxide film.
Figure 28C:
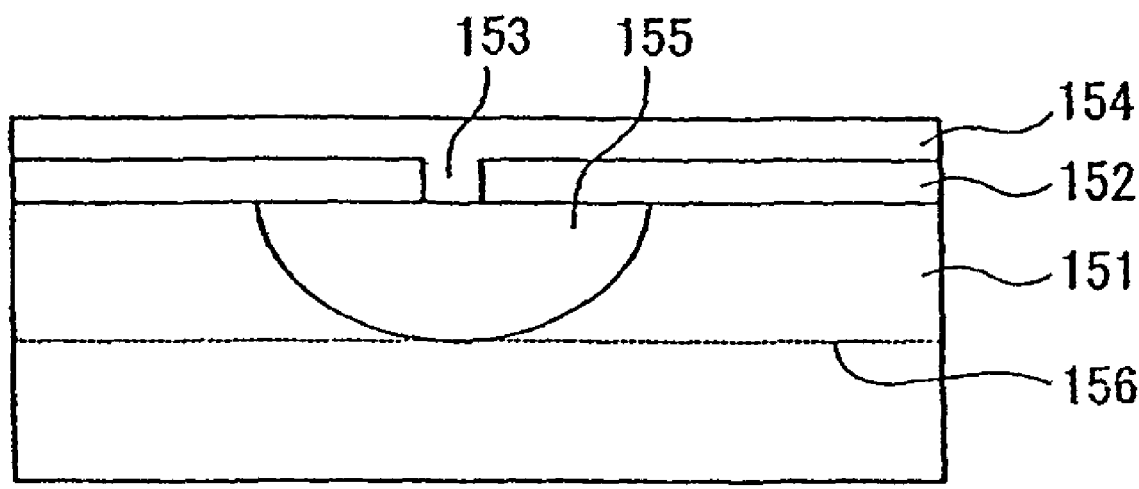
FIG. 28C is a cross sectional view showing a principal part of a related reverse-blocking IGBT in a state in the course of being manufactured at the step next to that shown in FIG. 28B in which state an isolation layer is formed in the semiconductor wafer.
Figure 29:
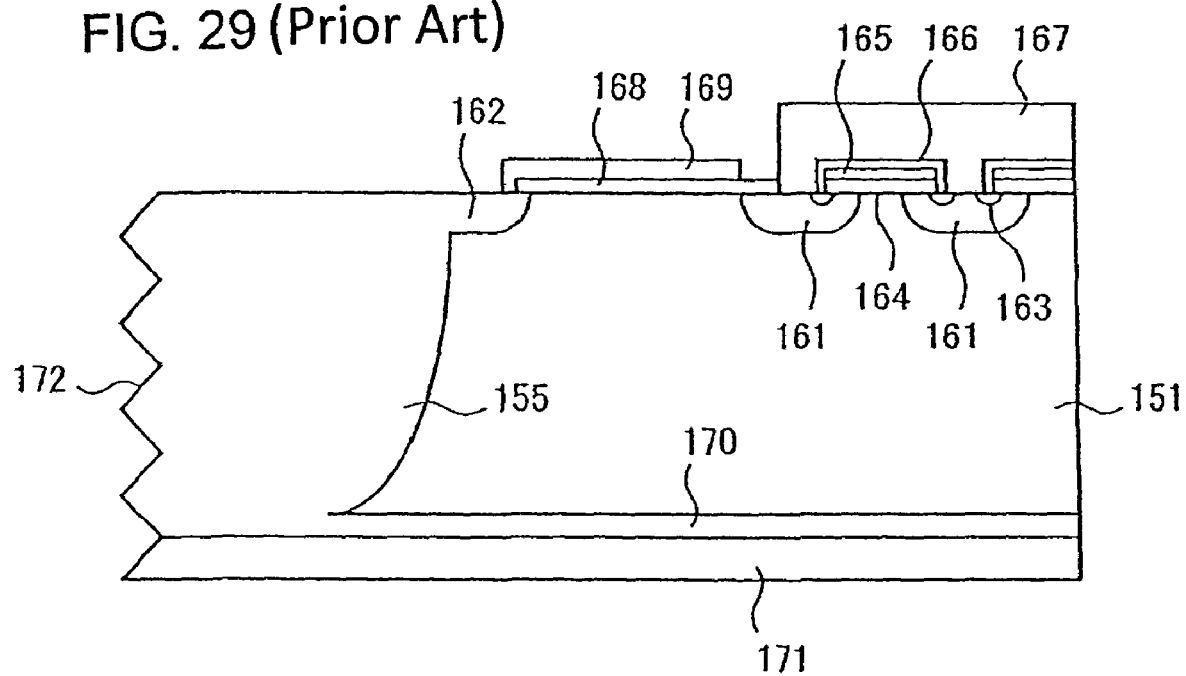
FIG. 29 is a cross sectional view showing a principal part of a related reverse-blocking IGBT whose isolation layer is formed by the method shown in FIGS. 28A to 28C.
Figure 30A:
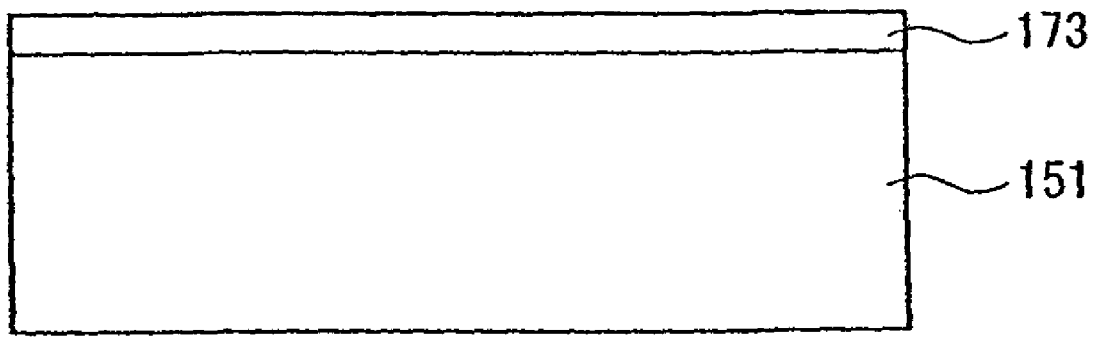
FIG. 30A is a cross sectional view showing a principal part of a related reverse-blocking IGBT in a state in the course of being manufactured by a related manufacturing method in which state an oxide film is formed as an etching mask on a semiconductor wafer.
Figure 30B:
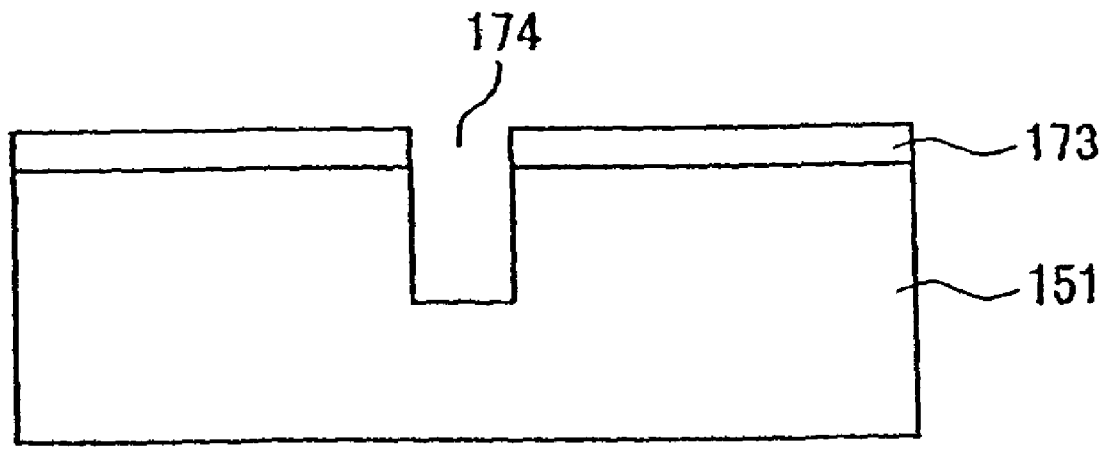
FIG. 30B is a cross sectional view showing a principal part of a related reverse-blocking IGBT in a state in the course of being manufactured at the step next to that shown in FIG. 30A in which state a trench is formed.
Figure 32:
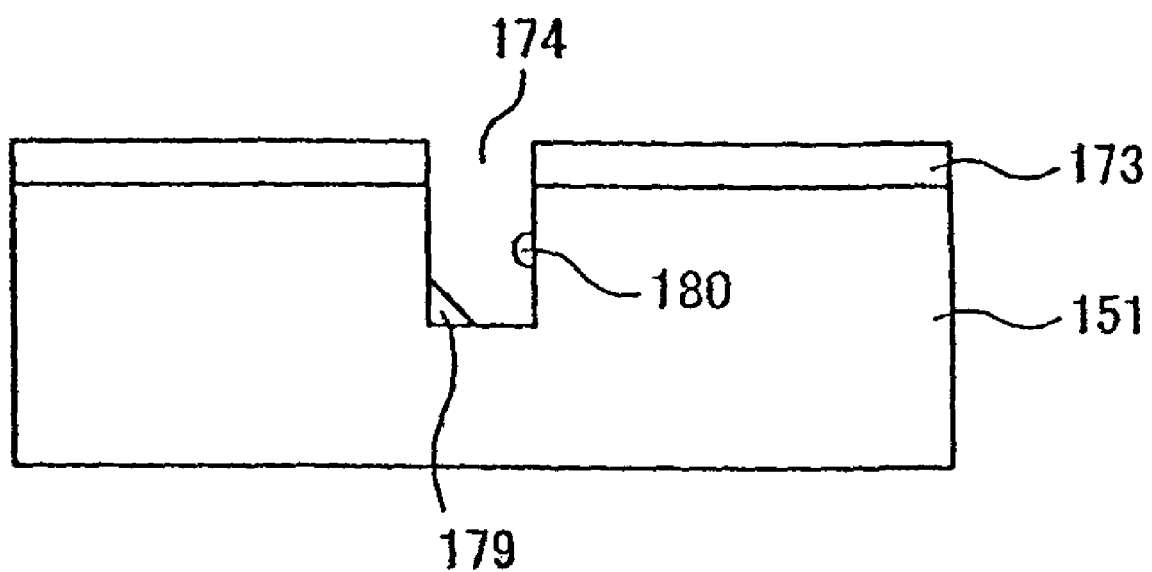
FIG. 32 is a cross sectional view showing a state in which residues such as a chemical residue and a resist residue are left in the trench.

FIG. 26 and FIG. 27 are cross sectional views showing a method of manufacturing a reverse-blocking IGBT according to embodiment 5 of the invention in the order of manufacturing steps with the IGBT presented by its principal part. As shown in FIG. 26 and FIG. 27, the method of manufacturing a reverse-blocking IGBT according to embodiment 5 is provided as follows. Namely, in the method of manufacturing an IGBT according to embodiment 4, after the isolation layer is formed, dicing (laser dicing) 148 is carried out by laser irradiation to cut p collector region 110 and collector electrode 111 at the bottom of the trench. Then, thermal foaming tape 138 is heated so that thin semiconductor wafer 101 is removed from double-sided adhesive tape 137. Elements similar to those in embodiment 4 are denoted with the same reference numerals and signs as those in embodiment 4, and explanations about these are omitted.

Although not particularly limited, laser dicing 148 is carried out by a YAG2ω double-pulse laser (with a total irradiation energy density of 6 J/cm² from two laser pulses (3 J/cm²+3 J/cm²), with a wavelength of 532 nm and a delay time of 0 ns between the two laser pulses (no delay time is provided)), for example. At this time, the diameter of the laser beam is narrowed so that dicing of a micro-region can be carried out. After laser dicing 148 is finished, as in embodiment 3, thermal foaming tape 138 is heated to remove thin semiconductor wafer 101 from double-sided adhesive tape 137. When ion implantation is carried out, ideal masking is made to cover the trench section only.

Here, in the laser annealing process, the laser annealing is carried out with the irradiation being made to leave no work mark (in a state of no work mode). An adequate irradiation energy density at this time is 2 J/cm² or less per one pulse when YAG2ω laser is used as in embodiment 5. While, in the laser dicing process, the dicing is carried out with the irradiation being made to enter a work mode. For bringing the irradiation into the work mode, it is necessary only that the irradiation energy density be brought to 2 J/cm² or more per one pulse. When collector electrode 111 with a thickness of several micrometers is cut, an adequate irradiation energy density is on the order of 3 J/cm² per one pulse.

According to embodiment 5, after laser dicing 148 is carried out, double-sided adhesive tape 137 is removed from thin semiconductor wafer 101 to make wafer According to embodiment 5, after laser dicing 148 is carried out, double-sided adhesive tape 137 is removed from thin semiconductor wafer 101 to make wafer 101 provided as individual chips. This allows collector electrode 111 to be diced neatly without presenting any excessive portions and any insufficient portions under isolation layer 145. Therefore, no collector electrode 111 is left with its portion being a little protruded from the edge of the chip and no collector electrode 111 is broken off in a portion under isolation layer 145. Moreover, no burr is left on the diced face of collector electrode 111 to allow a neat edge (diced face) of the chip to be obtained.

Furthermore, laser annealing and laser dicing can be successively carried out with the same laser irradiation device by adjusting irradiation energy density so as to be suited for the respective purposes. This makes it unnecessary to separately provide a device for laser annealing and a device for laser dicing, so that there is a high device merit. In addition to the YAG2ω double-pulse laser, an excimer (such as XeF and XeCl) laser, a YAG3ω laser, YLF2ω laser or a semiconductor laser can be also used for carrying out the invention with their respective irradiation energy densities adjusted.

In the foregoing, the invention is not limited to the above-explained embodiments but can be variously modified. In the above-described embodiments, the first conductivity type was taken as an n-type and the second conductivity type was taken as a p-type. The invention, however, is also valid even though the conductivity types are reversed. Furthermore, the invention can be validly applicable not only to the reverse-blocking IGBT but also to other kinds of reverse-blocking devices and bi-directional devices, or to semiconductor devices such as MOSFETs, bipolar transistors, MOS thyristors each of whose manufacturing processes is accompanied by formation of an isolation layer.

As explained in the foregoing, the semiconductor devices and the methods of manufacturing the devices according to the invention are useful for power semiconductor devices used for a system such as a power conversion system, and in particular, are suited for bi-directional devices or reverse-blocking devices.

Thus, a semiconductor device and manufacturing method have been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

What is claimed is:

1. A method of manufacturing a semiconductor device having:
   a second conductivity type base region selectively provided in a surface region on a first principal surface of a first conductivity type semiconductor substrate;

a first conductivity type emitter region selectively provided in a surface region on the base region;

a MOS gate structure including:

a gate insulator film provided on a surface of a section of the base region, the section being positioned between the semiconductor substrate and the emitter region; and a gate electrode provided on the gate insulator film; an emitter electrode in contact with the emitter region and the base region;

a second conductivity type collector layer provided on a surface layer of a second principal surface of the semiconductor substrate;

a collector electrode in contact with the collector layer; and a second conductivity type isolation layer surrounding the MOS gate structure, reaching from the first principal surface to the second principal surface while being inclined to the second principal surface, and being coupled to the collector layer, each of the first principal surface and the second principal surface being a {100} plane, and a surface of an isolation layer being a {111} plane, the method including the steps of:

covering the first principal surface of the first conductivity type semiconductor substrate with a mask having openings of a desired pattern;

forming a trench whose cross sectional shape is a trapezoid-shape on the semiconductor substrate by etching sections of the first principal surface of the semiconductor substrate without using a mask in areas of the openings, said etching being wet anisotropic etching with an alkaline solution; and forming the second conductivity type isolation layer by introducing a second conductivity type impurity into a side wall of the trench.

2. The method of manufacturing a semiconductor device as claimed in claim 1, wherein the trench is formed so as to be inclined at an angle of 54.7° to the second principal surface, and the second conductivity type impurity is introduced into the side wall by ion implantation.

3. The method of manufacturing a semiconductor device as claimed in claim 1, wherein after the MOS gate structure including the gate insulator film and the gate electrode is formed on the first principal surface side, the formation of the trench and the introduction of the second conductivity type impurity are carried out in order to form the second conductivity type isolation layer.

4. The method of manufacturing a semiconductor device as claimed in claim 1, wherein after the MOS gate structure including the gate insulator film and the gate electrode is formed, and the emitter electrode is formed on the first principal surface side, the formation of the trench and the introduction of the second conductivity type impurity are carried out in order to form the second conductivity type isolation layer.

5. The method of manufacturing a semiconductor device as claimed in claim 1, wherein after the MOS gate structure including the gate insulator film and the gate electrode is formed, and the emitter electrode is formed on the first principal surface side and the surface protection film of the first principal surface side is formed, the formation of the trench and the introduction of the second conductivity type impurity are carried out in order to form the second conductivity type isolation layer.

6. The method of manufacturing a semiconductor device as claimed in claim 1, wherein the second conductivity type impurity is introduced into the side wall of the trench before the trench is filled with one of an insulator film and a semiconductor film, followed by heat treatment.

7. The method of manufacturing a semiconductor device as claimed in claim 2, wherein the second conductivity type impurity is introduced into the side wall of the trench before the trench is filled with one of an insulator film and a semiconductor film, followed by heat treatment.

8. The method of manufacturing a semiconductor device as claimed in claim 5, wherein the second conductivity type impurity is introduced into the side wall of the trench before the trench is filled with one of an insulator film and a semiconductor film, followed by heat treatment.

* * * * *